US012586513B2

(12) United States Patent
Jang et al.

(10) Patent No.: US 12,586,513 B2
(45) Date of Patent: Mar. 24, 2026

(54) DISPLAY DEVICE

(71) Applicant: LG DISPLAY CO., LTD., Seoul (KR)

(72) Inventors: Min-June Jang, Seoul (KR); Miyoung Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/433,649

(22) Filed: Feb. 6, 2024

(65) Prior Publication Data

US 2024/0282246 A1 Aug. 22, 2024

(30) Foreign Application Priority Data

Feb. 20, 2023 (KR) ........................ 10-2023-0022340

(51) Int. Cl.
*G09G 3/32* (2016.01)
*H10D 86/40* (2025.01)
*H10D 86/60* (2025.01)

(52) U.S. Cl.
CPC ............ *G09G 3/32* (2013.01); *H10D 86/441* (2025.01); *H10D 86/60* (2025.01); *G09G 2300/0426* (2013.01); *G09G 2300/0452* (2013.01); *G09G 2310/0267* (2013.01); *G09G 2310/08* (2013.01)

(58) Field of Classification Search
None
See application file for complete search history.

(56) References Cited

U.S. PATENT DOCUMENTS

2022/0122541 A1* 4/2022 Chung ................. G09G 3/3258
2022/0208946 A1* 6/2022 Kim ................... H10K 59/1315

* cited by examiner

*Primary Examiner* — Ifedayo B Iluyomade
(74) *Attorney, Agent, or Firm* — Fish & Richardson P.C.

(57) ABSTRACT

A display device includes a substrate including a plurality of pixel areas and a plurality of driving circuit areas, wherein each of the plurality of driving circuit areas is disposed between adjacent pixel areas; a plurality of pixel circuits respectively disposed in the plurality of pixel areas; a plurality of light-emission driving circuits respectively disposed in the plurality of driving circuit areas; a light-emission line disposed on the substrate and extending in a row direction, and connected to the pixel circuits arranged in the row direction; a plurality of light-emission driving lines disposed on the substrate and extending in the row direction; a plurality of clock signal lines disposed on the substrate and extending in a column direction; and a plurality of light-emitting elements disposed in each of the plurality of pixel areas.

21 Claims, 10 Drawing Sheets

FIG. 6

DISPLAY DEVICE

CROSS-REFERENCE TO RELATED APPLICATIONS

This application claims priority from Korean Patent Application No. 10-2023-0022340 filed on Feb. 20, 2023 in the Korean Intellectual Property Office, and all the benefits accruing therefrom under 35 U.S.C. 119, the contents of which in its entirety are herein incorporated by reference.

TECHNICAL FIELD

The present disclosure relates to a display device, and more specifically, to a display device including a gate driving circuit capable of operating in a bi-directional manner.

BACKGROUND

A display device used in computer monitors, TVs, cell phones, etc. includes an organic light-emitting display device (OLED) that emits light by itself, and a liquid crystal display device (LCD) that requires a separate light source. etc.

The use of a display device is becoming more diverse, ranging from computer monitors and TVs to personal portable devices. Thus, research is being conducted on a display device that has a large display area size but reduced volume and weight.

Furthermore, recently, a display device including a light-emitting diode (LED) with an inorganic light-emitting element is attracting attention as a next-generation display device. Since the LED is made of an inorganic material, the display device has excellent reliability and has a longer lifespan compared to the liquid crystal display device or the organic light-emitting display device. Furthermore, the LED has a fast turn on/off speed excellent light-emitting efficiency, strong impact resistance, excellent stability, and may display a high-brightness image.

This display device includes a data driving circuit that supplies a data signal to data lines of a display panel, and a gate driving circuit that supplies a gate signal to gate lines of the display panel.

SUMMARY

A technical purpose that the present disclosure aims to achieve is to provide a gate driving circuit configured to control an inorganic light-emitting element to emit light, and disposed in a display area in a distributed manner to reduce a bezel of a display panel, and to provide a display device including the same.

Another technical purpose that the present disclosure is to provide a gate driving circuit that may operate in a bi-directional manner and a display device including the same.

Purposes according to the present disclosure are not limited to the above-mentioned purpose. Other purposes and advantages according to the present disclosure that are not mentioned may be understood based on following descriptions and may be more clearly understood based on aspects according to the present disclosure. Further, it will be easily understood that the purposes and advantages according to the present disclosure may be realized using means shown in the claims or combinations thereof.

To achieve the purposes as described above, a display device according to one aspect of the present disclosure includes a substrate, a plurality of pixel circuits, a plurality of light-emission driving circuits, a light-emission line, a plurality of light-emission driving lines, a plurality of clock signal lines, and a plurality of light-emitting elements. The substrate includes a plurality of pixel areas and a plurality of driving circuit areas, wherein each of the plurality of driving circuit areas is disposed between adjacent ones of the plurality of pixel areas. The plurality of pixel circuits are respectively disposed in the plurality of pixel areas. The plurality of light-emission driving circuits are respectively disposed in the plurality of driving circuit areas. The light-emission line is disposed on the substrate and extends in a row direction and is connected to the pixel circuits arranged in the row direction. The plurality of light-emission driving lines are disposed on the substrate and extend in the row direction, wherein the plurality of light-emission driving lines are connected to the light-emission driving circuit. The plurality of clock signal lines are disposed on the substrate and extend in a column direction, wherein the plurality of clock signal lines are disposed in and connected to each of the driving circuit areas. The plurality of light-emitting elements are disposed in each of the plurality of pixel areas.

To achieve the purposes described above, a display device according to one aspect of the present disclosure includes a substrate, a data pad and a gate pad, a gate driving circuit, a data line, a clock signal line, a gate line, and a plurality of light-emitting elements. The substrate includes a pixel area including a plurality of sub-pixels and a non-pixel area surrounding the pixel area. The data pad and the gate pad are disposed on one surface of the substrate and in the non-pixel area. The gate driving circuit is disposed between two adjacent pixel areas in the non-pixel area and is electrically connected to the gate pad. The data line is disposed on the substrate and in the pixel area and the non-pixel area and is connected to the data pad. The clock signal line is electrically connected to the gate driving circuits arranged in a column direction and is connected to the gate pad. The gate line is disposed on the substrate and extends in a row direction. The plurality of light-emitting elements are disposed on the substrate. The gate driving circuits arranged in the row direction are electrically connected to each other to provide a gate signal to the gate line.

Specific details of other aspects are included in the detailed description and drawings.

According to aspects of the present disclosure, the gate driving circuit including the light-emission driving circuit may be disposed in the display area of the display panel, thereby reducing the bezel area of the display panel and making it easier to implement a tiling display device.

Moreover, according to aspects of the present disclosure, the light-emission driving circuit includes the input signal separation circuit and the Q node charging circuit, and thus may operate in the bi-directional manner, that is, in a direction from an upper side to a lower side of the display panel, and a direction from the lower side to the upper side thereof in a plan view of the display panel, thus reducing a manufacturing cost thereof.

Moreover, according to aspects of the present disclosure, the light-emission driving circuit includes the input signal separation circuit, the Q node charging circuit, and the QB node holding circuit, and thus may operate in the bi-directional manner, that is, in a direction from an upper side to a lower side of the display panel, and a direction from the lower side to the upper side thereof in a plan view of the display panel, thus reducing a manufacturing cost thereof.

Moreover, according to aspects of the present disclosure, the light-emission driving circuit includes the Q node reset circuit. Thus, the output node and the QA node may be reset using the Q node reset circuit before an end of a current frame, thereby preventing abnormal operation of a next frame thereto.

Moreover, according to aspects of the present disclosure, the light-emission driving circuit includes the inverter circuit to invert the voltage of the Q node to provide the voltage to the QB node, thereby improving the accuracy of the light-emission signal.

Moreover, according to aspects of the present disclosure, the light-emission driving circuit includes the Q node holding circuit to maintain the Q node at the high voltage such that the light-emission transistor is kept in a turned-off state during a period for which the light-emitting element does not emit light.

Effects of the present disclosure are not limited to the effects mentioned above, and other effects not mentioned will be clearly understood by those skilled in the art from the description below.

In addition to the above effects, specific effects of the present disclosure are described together while describing specific details for carrying out the present disclosure.

BRIEF DESCRIPTION OF THE DRAWINGS

FIG. 6 is a diagram showing an arrangement of a unit pixel area and a gate driving circuit area in a display device according to an aspect of the present disclosure.

DETAILED DESCRIPTION

Figure 1:
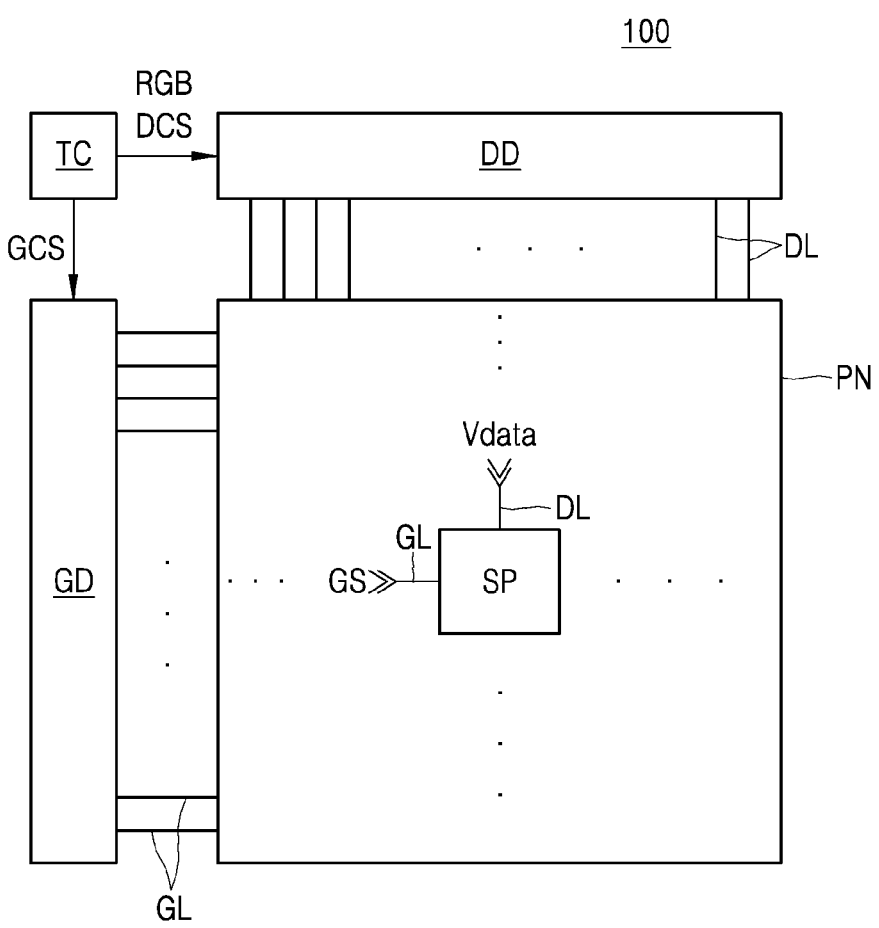
FIG. 1 is a schematic diagram of a display device according to one aspect of the present disclosure.

Advantages and features of the present disclosure, and a method of achieving the advantages and features will become apparent with reference to aspects described later in detail together with the accompanying drawings. However, the present disclosure is not limited to the aspects as disclosed under but may be configured in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating aspects of the present disclosure are illustrative, and the present disclosure is not limited thereto.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expressions such as "at least one of" when preceding a list of elements may modify the entire list of elements and may not modify the individual elements of the list. The interpretation of numerical values, an error or tolerance therein may occur even when there is no explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

When a certain aspect may be configured differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

The features of the various aspects of the present disclosure may be partially or entirely combined with each other and may be technically associated with each other or operate with each other. The aspects may be configured independently of each other and may be configured together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects," and the like should not be construed such that any aspect or design as described is superior to or advantageous over other aspects or designs.

Further, the term "or" means "inclusive or" rather than "exclusive or". That is, unless otherwise stated or clear from the context, the expression that "x includes a or b" means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the detailed descriptions.

In description of flow of a signal, for example, when a signal is delivered from a node A to a node B, this may include a case where the signal is transferred from the node A to the node B via another node unless a phrase "immediately transferred" or "directly transferred" is used.

Hereinafter, various aspects of the present disclosure are described in detail with reference to the attached drawings.

FIG. 1 is a schematic diagram of a display device according to one aspect of the present disclosure.

For convenience of illustration, FIG. 1 shows only a display panel PN, a gate driver GD, a data driver DD, and a timing controller TC among various components of a display device 100. Positions of the display panel PN, the gate driver GD, the data driver DD, and the timing controller TC as shown in FIG. 1 are illustrated for convenience and may vary.

Referring to FIG. 1, the display device 100 includes the display panel PN including a plurality of sub-pixels SP, the gate driver GD and the data driver DD that supply various signals to the display panel PN, and the timing controller TC that controls the gate driver GD and the data driver DD.

The display panel PN is configured to display an image to a user and includes a plurality of sub-pixels SP. In the display panel PN, a plurality of gate lines GL and a plurality of data lines DL intersect with each other, and each of the plurality of sub-pixels SP is connected to the gate line SL and the data line DL. In addition, each of the plurality of sub-pixels SP may be connected to power lines (e.g., voltage lines) such as a high-potential line, a low-potential line, and a reference line.

The plurality of sub-pixels SP is a minimum unit that constitutes a screen, and each of the plurality of sub-pixels SP includes a light-emitting element and a pixel circuit for driving the light-emitting element. A type of each of a plurality of light-emitting elements may be defined depending on a type of the display panel PN. For example, when the display panel PN is an inorganic light-emitting display panel, the light-emitting element may be configured as an LED or a micro-LED. In some aspects, a micro-LED is self-emissive and does not require a separate lighting source to emit light (e.g., a backlight).

The gate driver GD supplies a plurality of gate signals GS to the plurality of gate lines GL according to a plurality of gate control signals GCS provided by the timing controller TC. FIG. 1 shows that the gate driver GD is spaced apart from and disposed on one side of the display panel PN and is formed as one block. However, the number and arrangement of the gate drivers GD are not limited thereto.

The data driver DD converts image data RGB input from the timing controller TC into a data voltage Vdata using a reference gamma voltage according to the plurality of data control signals DCS provided from the timing controller TC. The data driver DD may supply the converted data voltage Vdata to the plurality of data lines DL.

The timing controller TC arranges the image data RGB input from an external source and supplies the arranged image data to the data driver DD. The timing controller TC may generate the gate control signal GCS and a data control signal DCS using synchronization signals input from an external source, such as a dot clock signal, a data enable signal, and a horizontal/vertical synchronization signal. Then, the timing controller TC supplies the generated gate control signal GCS and the generated data control signal DCS to the gate driver GD and the data driver DD, respectively to control the gate driver GD and the data driver DD, respectively.

Hereinafter, the display panel PN of the display device 100 according to one aspect of the present disclosure will be described in more detail.

Figure 2:
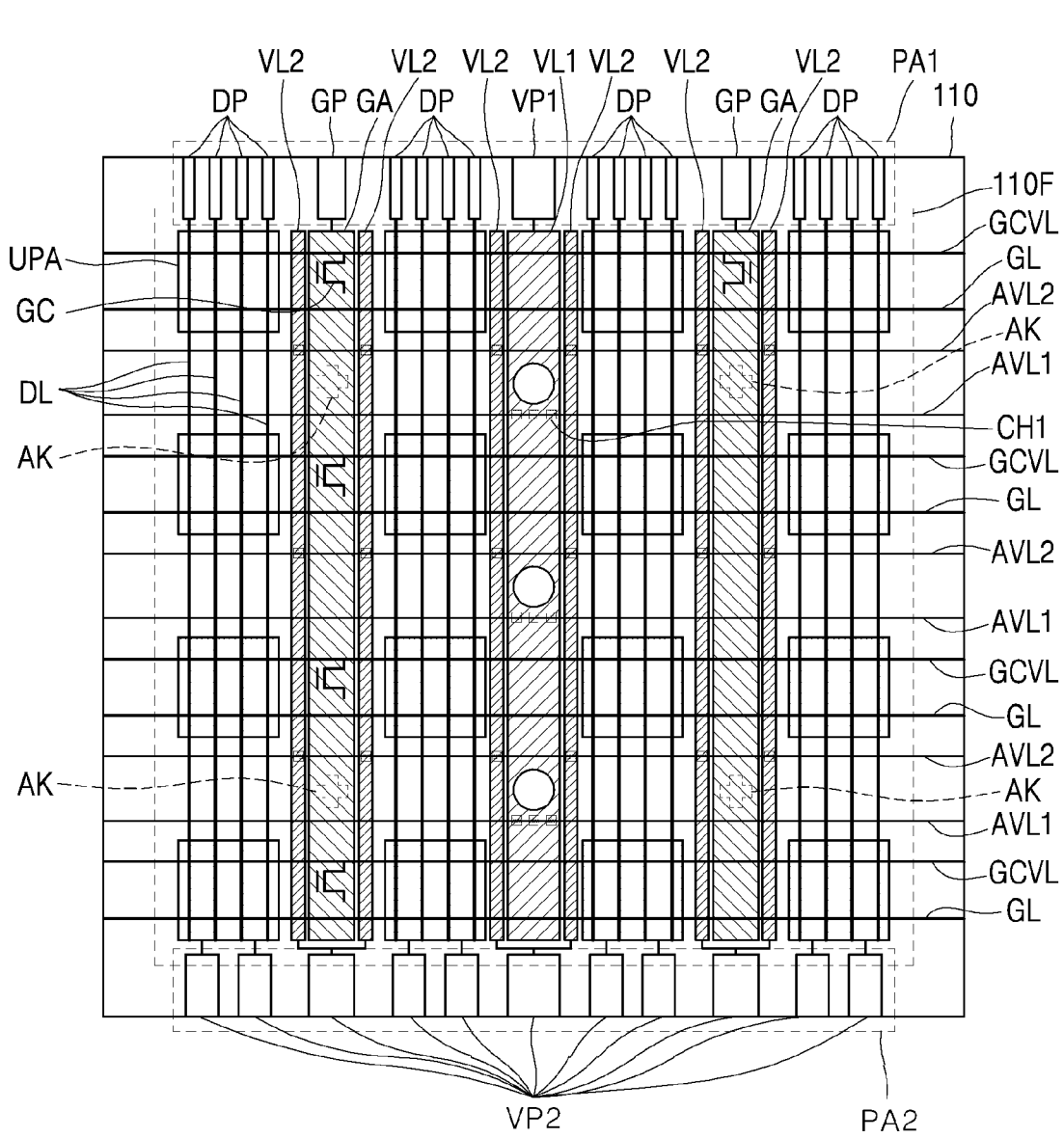
FIG. 2 is a schematic plan view of a display panel included in a display device according to an aspect of the present disclosure.

FIG. 2 is a schematic plan view of a display panel included in a display device according to one aspect of the present disclosure. In FIG. 2, for convenience of illustration, a substrate 110, a plurality of unit pixel areas UPA, a plurality of pads VP1, VP2, DP, and GP, and a plurality of lines among the various components of the display device 100 are shown. Moreover, FIG. 3 is a plan view of a unit pixel area UPA included in the display device according to one aspect of the present disclosure.

Figure 3:
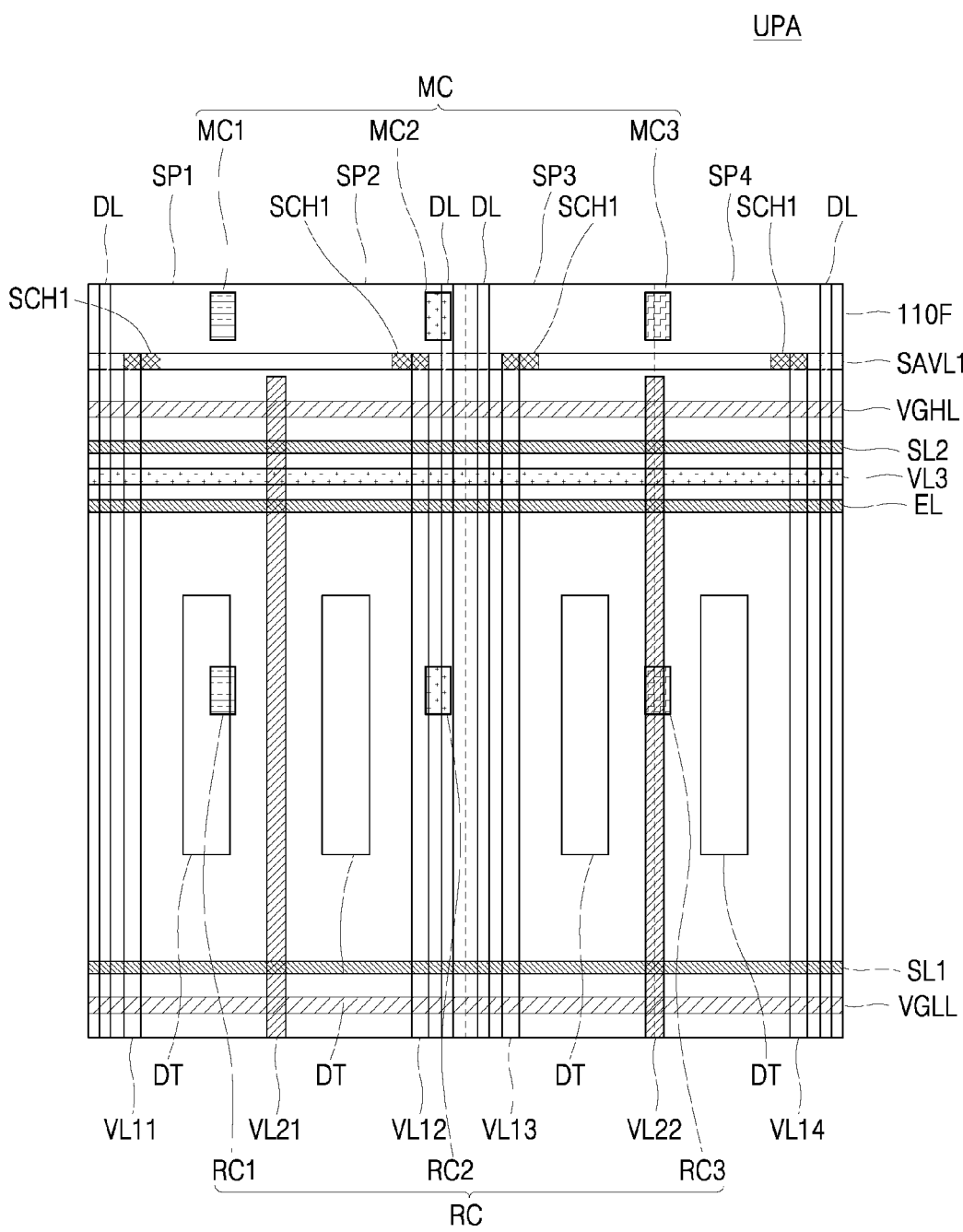
FIG. 3 is an enlarged plan view of a unit pixel included in a display device according to an aspect of the present disclosure.

Referring to FIG. 2 and FIG. 3, the substrate 110 is configured to support various components included in the display panel PN and may be made of an insulating material. For example, the substrate 110 may be made of glass or resin. Alternatively, the substrate 110 may be made of polymer or plastic, or may be made of a material with flexibility.

The substrate 110 may be divided into a display area and a non-display area. The display area is where an image is displayed by emitting light from the plurality of unit pixel areas UPA. Each of the plurality of unit pixel areas UPA may include at least two or more sub-pixels SP. Each of the unit pixel areas UPA is shown to include four sub-pixels SP1, SP2, SP3, and SP4. However, the present disclosure is not limited thereto. The four sub-pixels include the first sub-pixel SP1, the second sub-pixel SP2, the third sub-pixel SP3, and the fourth sub-pixel SP4. Moreover, the unit pixel area UPA may be referred to as a pixel area for convenience, and the non-display area may be referred to as a non-pixel area.

Each of the plurality of sub-pixels is an individual unit that emits light. A light-emitting element MC and RC and a pixel circuit are disposed in each of the plurality of sub-pixels. A unit pixel composed of the four sub-pixels SP1, SP2, SP3, and SP4 may include at least two of a red sub-pixel, a green sub-pixel, and a blue sub-pixel, or may include at least two of a red sub-pixel, a green sub-pixel, a blue sub-pixel, and a white sub-pixel. However, the present disclosure is not limited thereto. The unit pixel may include at least two sub-pixels, each including a light-emitting element having the lowest light-emission efficiency among a red light-emitting element, a green light-emitting element, and a blue light-emitting element. In the LED, the red light-emitting element has the lowest light-emission efficiency.

In one example, the pixel circuit includes the driving transistor DT that provides driving current to the light-emitting elements MC and RC. Some of the plurality of light-emitting elements MC and RC may be disposed to overlap the driving transistor DT.

The display device 100 according to one aspect of the present disclosure may include the first and second sub-pixels SP1 and SP2 emitting red light, the third sub-pixel SP3 emitting green light, and the fourth sub-pixel SP4 emitting blue light. The first sub-pixel SP1, the second sub-pixel SP2, the third sub-pixel SP3, and the fourth sub-pixel SP4 may be arranged side by side in a row direction.

As mentioned above, the display area is where the plurality of unit pixels are disposed, and the non-display area is where the image is not displayed, that is, an area in which the plurality of unit pixels are not disposed. For example, the non-display area includes the gate driver GD for driving the pixel SP, a line, and a pad for applying signals to the line The gate driver GD supplies the gate signal to the plurality of sub-pixels SP via the gate line GL. The gate signal includes a scan signal and a light-emission signal. The scan signal is provided via the scan line SL, and the light-emission signal is provided via a light-emission line EL. Moreover, the scan line SL and the light-emission line EL may be collectively referred to as the gate line GL. In some cases, the scan line SL may include at least one scan line. For example, in the present disclosure, an example in which the scan line SL includes a first scan line SL1 and a second scan line SL2 is described.

The gate driver GD includes a scan driver that provides the scan signal and a light-emission driver that provides the light-emission signal.

In the display device 100 according to one aspect of the present disclosure, the gate driver GD may include a plurality of gate driving circuits GC disposed on the substrate 110. Each of the plurality of gate driving circuits GC may be disposed in each gate driving circuit area GA defined between adjacent ones of the plurality of unit pixel areas UPA. The gate driver GD may be configured as a collection of the gate driving circuits GC.

In the display device 100 according to one aspect of the present disclosure, the light-emitting element may be configured as an LED or an inorganic light-emitting element. Because the LED has excellent light-emitting efficiency, a size of the light-emitting element MC and RC in the unit pixel area UPA may be very small. Accordingly, the pixel circuit may be disposed in each of the sub-pixels SP1, SP2, SP3, and SP4, and at least one light-emitting element MC and RC connected to the pixel circuit may be disposed in each of the sub-pixels SP1, SP2, SP3, and SP4. Moreover, the gate driving circuit GC may be disposed in the non-display area.

The light-emitting elements MC and RC may be transferred onto the substrate 110 using a transfer process. In this case, an alignment key AK may be disposed in the gate driving circuit area GA for aligning the light-emitting element MC and RC to a target location of the substrate 110. The align key AK may be disposed between adjacent ones of the gate driving circuits GC arranged in a column direction in the gate driving circuit area GA.

The gate driving circuit area GA in FIG. 2 is disposed between unit pixel areas UPA adjacent to each other in the row direction, and the gate driving circuit GC is disposed in the gate driving circuit area GA. The gate driving circuit GC may be electrically connected to a plurality of sub-pixels arranged in the row direction and may provide the gate signal to sub-pixels arranged in the same row. In this case, a gate driving line GCVL may extend in the row direction and transmits a signal to operate the gate driving circuit GC. The gate driving line GCVL includes a high voltage line VGHL and a low voltage line VGLL. The high voltage line VGHL and the low voltage line VGLL may extend in the row direction in the unit pixel area UPA.

As described previously, the gate driver includes the scan driver and the light-emission driver. Thus, the gate driving circuit GC includes a scan driving circuit and a light-emission driving circuit. The gate driving circuit may be referred to as a scan driving circuit or a light-emission driving circuit. Furthermore, the gate driving line may be referred to as a scan driving line or a light-emission driving line. In one example, the scan driving circuit and the light-emission driving circuit may be disposed in the same row. In other examples, the scan driving circuit and the light-emission driving circuit may be disposed in different areas.

The data driver DD converts the image data into a data signal and supplies the converted data signal to the sub-pixels SP1, SP2, SP3, and SP4 via the data line DL. The data driver DD may be formed on a rear surface of the substrate 110 or may be formed on a separate substrate. When the data driver DD is formed on a surface of the separate substrate, the other surface thereof on which the data driver DD is not formed may be bonded to a rear surface of the substrate 110 to face each other. To electrically connect the front and rear surfaces of the substrate 110 to each other or to electrically connect the front surface of the substrate 110 and the other surface of the separate substrate to each other, a side line is disposed on a side surface of the substrate 110 or a side surface of the substrate separate from the substrate 110. Accordingly, the data driver disposed on the rear surface of the substrate 110 or the other surface of the separate substrate may supply the data signal to the sub-pixel SP via the side line.

As described above, in the display device 100 according to one aspect of the present disclosure, the gate driving circuit GC may be disposed between adjacent unit pixels and on the substrate 110. However, the present disclosure is not limited thereto, and the gate driver GD may be disposed on one side or each of both opposing sides of the substrate 110.

The gate line GL may extend in the row direction and may be disposed on the substrate 110, and the data line DL may extend in the column direction and may be disposed on the substrate 110. The gate line GL and the data line DL may be disposed in all of the sub-pixels SP and provide signals to the pixel circuit disposed in the sub-pixel SP.

Pad areas PA1 and PA2 are arranged are respectively disposed at both opposing sides in the column direction of the substrate 110. In this case, the pad area formed at an upper side in FIG. 2 of the substrate 110 is referred to as the first pad area PA1, and the pad area formed at a lower side in FIG. 2 of the substrate 110 is referred to as the second pad area PA2. In the substrate 110, the first pad area PA1 and the second pad area PA2 are opposite to each other.

A data pad DP connected to the data line DL, a gate pad GP connected to the gate driver GD, a high-potential voltage pad VP1 connected to the high-potential voltage line VL1, and a reference voltage pad connected to the reference voltage line VL3 may be disposed in the first pad area PA1. In this case, the number of the data pads DP arranged therein may be equal to the number of sub-pixels SP included in the unit pixel. The high-potential voltage line VL1 may be referred to as a first power line, and the reference voltage line VL3 may be referred to as a third power line.

Lines that provide various clock signals, a line that provides a gate low voltage, and a line that provides a gate high voltage may be connected to the gate driving circuit GC. The gate driving circuits GC are arranged side by side in the column direction. Thus, the lines that transmit signals to the gate driving circuits GD may extend along the column direction. The lines that transmit the signals to the gate driving circuits GD may be referred to as gate driving lines, and the gate driving lines may extend in the column direction and may be connected to the gate pad GP disposed in the first pad area PA1 and may receive the signals therefrom.

Referring to FIG. 2, the high-potential voltage line VL1 may extend in the column direction and may be disposed between adjacent unit pixel areas UPA. The high-potential voltage line VL1 extending in the column direction provides the high-potential voltage to the plurality of sub-pixels SP via the high-potential voltage pad VP1 in the first pad area PA1. A plurality of high-potential voltage lines VL1 extending in the column direction and arranged in the row direction may be connected to auxiliary high-potential voltage lines AVL1 extending in the row direction and arranged in the column direction to form a mesh line structure. The auxiliary high-potential voltage line AVL1 may extend along each row in which the unit pixel areas UPA are arranged, and may be disposed between unit pixel areas UPA adjacent to each other in the column direction. The auxiliary high-potential voltage line AVL1 may prevent voltage drop of the high-potential voltage line VL1 and may provide the high-potential voltage to the plurality of sub-pixels SP.

Referring to FIG. 3, high-potential voltage lines VL11, VL12, VL13, and VL14 may extend in the column direction and may be respectively disposed in the sub-pixels SP1, SP2, SP3, and SP4 of a unit pixel area UPA. The plurality of high-potential voltage lines VL11, VL12, VL13, and VL14 in the unit pixel area UPA may be electrically connected to an auxiliary high-potential voltage line SAVL1 extending in the row direction and disposed in the unit pixel area UPA via contact holes SCH1 to form a mesh structure.

The high-potential voltage lines VL1, VL11, VL12, VL13, and VL14 and the auxiliary high-potential voltage lines AVL1 and SAVL1 disposed inside and outside the unit pixel area UPA may be electrically connected to each other to form a mesh structure. The mesh structure may receive the high-potential voltage via the high-potential voltage pad VP1.

The low-potential voltage pad VP2 connected to the low-potential voltage lines VL2 may be disposed in the second pad area PA2. The low-potential voltage lines VL2 may extend in the column direction, and may be respectively disposed on both opposing sides of the gate driving circuit area GA and between adjacent unit pixel areas UPA to provide the low-potential voltage to the sub-pixels. However, the present disclosure is not limited thereto. Low-potential voltage lines VL21 and VL22 may extend in the column direction and may be disposed in the unit pixel area UPA. The low-potential voltage lines VL2, VL21, and VL22 may be referred to as the second power line.

The plurality of low-potential voltage lines VL2 are arranged in the row direction, connected to auxiliary low-potential voltage lines AVL2 extending in the row direction, and arranged in the column direction to form a mesh structure. The auxiliary low-potential voltage line AVL2 may extend in each of a plurality of rows where the unit pixel areas UPA are arranged and may be disposed between adjacent unit pixel areas UPA. The auxiliary low-potential voltage line AVL2 may prevent voltage drop of the low-potential voltage line VL2 and may provide the low-potential voltage to the plurality of sub-pixels.

The reference voltage line VL3 may extend in the row direction and may be disposed in each of the unit pixel areas UPA arranged in the row direction. The reference voltage line VL3 extending in the row direction provides the reference voltage to the unit pixel via a separate line extending in the column direction. The reference voltage line VL3 may be connected to the reference voltage pad disposed in the first pad area PA1. Thus, the reference voltage is provided to a plurality of reference voltage lines VL3 via the reference voltage pad.

In the display panel PN included in the display device 100 according to one aspect of the present disclosure, an edge of the substrate 110 may be removed by grinding the edge of the substrate 110 to reduce the size of the bezel. The bezel is an edge area of the substrate 110 where the sub-pixels SP1, SP2, SP3, and SP4 are not disposed. During the grinding, a portion of each of the pad and the line disposed in the edge of the substrate 110 may be removed, such that the size of the substrate 110 is reduced, making it possible to implement the display panel PN with a size of a final substrate 110F.

Specifically, in the final substrate 110F, a significant amount of each of the pads disposed in each of the first pad area PA1 and the second pad area PA2 may be removed, leaving only a portion or a trace of each of the pads.

Hereinafter, description about the pixel circuit included in each of the plurality of sub-pixels SP1, SP2, SP3, and SP4 will be made.

Figure 4:
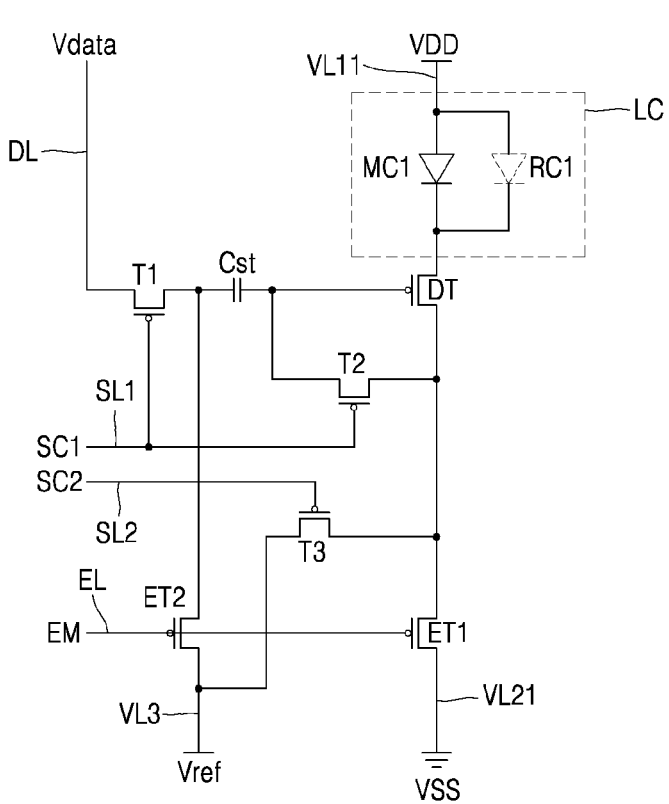
FIG. 4 is a circuit diagram of a pixel circuit included in a display device according to an aspect of the present disclosure.

FIG. 4 is a circuit diagram of the pixel circuit included in the display device according to an aspect of the present disclosure. Specifically, FIG. 4 is a circuit diagram of the pixel circuit included in the first sub-pixel SP1, and the same pixel circuit may be included in each of the other sub-pixels SP2, SP3, and SP4.

Referring to FIG. 4, the first sub-pixel SP1 includes a light-emitting element LC and a pixel circuit that provides the driving current to the light-emitting element LC.

The light-emitting element LC may include, but is not limited to, a first main light-emitting element MC1 and a first auxiliary light-emitting element RC1. For example, a pixel circuit included in the first sub-pixel SP1 may be referred to as a first pixel circuit, and a pixel circuit included in the second sub-pixel SP2 may be referred to as a second pixel circuit. A pixel circuit included in the third sub-pixel SP3 may be referred to as a third pixel circuit, and a pixel circuit included in the fourth sub-pixel SP4 may be referred to as a fourth pixel circuit. In this case, the first pixel circuit may be connected to the first main light-emitting element MC1. The second pixel circuit may be connected to the first auxiliary light-emitting element RC1, and the third pixel circuit may be connected to a second main light-emitting element MC2, and a second auxiliary light-emitting element RC2. The fourth pixel circuit may be connected to a third main light-emitting element MC3 and a third auxiliary light-emitting element RC3. When two light-emitting elements are connected to one pixel circuit, the two light-emitting elements may be connected in parallel with each other.

FIG. 4 illustrates a case where the first main light-emitting element MC1 and the first auxiliary light-emitting element RC1 are connected to each other in a parallel manner to each other. An anode electrode of the first main light-emitting element MC1 and an anode electrode of the first auxiliary light-emitting element RC1 are connected to the high-potential voltage line VL11 to which the high-potential voltage VDD is applied. Moreover, a cathode electrode of the first main light-emitting element MC1 and a cathode electrode of the first auxiliary light-emitting element RC1 are connected to the pixel circuit.

The pixel circuit may include 6 transistors and 1 capacitor. Each of the transistors may be configured as a thin-film transistor and may be an N-type or P-type transistor. In the present disclosure, a case in which each transistor is configured as the P-type transistor is described by way of example. Further, the transistor may be made of a semiconductor material such as oxide semiconductor, amorphous silicon, or polysilicon. However, the present disclosure is not limited thereto.

A driving transistor DT includes a gate electrode, a source electrode, and a drain electrode, wherein the gate electrode is connected to one electrode of a capacitor Cst, and the source electrode is connected to the cathode electrode of each of the first main light-emitting element MC1 and the first auxiliary light-emitting element RC1, and the drain electrode is connected to a source electrode of a first light-emission transistor ET1. The driving transistor DT is controlled based on a voltage applied to the gate electrode, which controls a voltage of the cathode electrode of the light-emitting element LC. Accordingly, each of the first main light-emitting element MC1 and the first auxiliary light-emitting element RC1 may emit light.

A first transistor T1 includes a gate electrode, a source electrode, and a drain electrode. The gate electrode is connected to the first scan line SL1, the source electrode is connected to the data line DL, and the drain electrode is connected to the other electrode of the capacitor Cst. The first transistor T1 is controlled based on the first scan signal SC1 to provide the data voltage Vdata to the other electrode of the capacitor Cst.

A second transistor T2 includes a gate electrode, a source electrode, and a drain electrode. The gate electrode is connected to the first scan line SL1, the source electrode is connected to the one electrode of the capacitor Cst, and the drain electrode is connected to the drain electrode of the driving transistor DT. The second transistor T2 is controlled based on the first scan signal SC1 to allow the gate electrode and the drain electrode of the driving transistor DT to be electrically connected to each other such that the driving transistor DT acts as a diode. Accordingly, the second transistor T2 samples a threshold voltage of the driving transistor DT.

A third transistor T3 includes a gate electrode, a source electrode, and a drain electrode, the gate electrode is connected to the second scan line SL2, the source electrode is connected to the drain electrode of the driving transistor DT, and the drain electrode is connected to the reference voltage line VL3. The third transistor T3 is controlled based on the second scan signal SC2 to provide a reference voltage Vref to the drain electrode of the driving transistor DT.

The first light-emission transistor ET1 includes a gate electrode, the source electrode, and a drain electrode. The gate electrode is connected to the light-emission line EL, the source electrode is connected to the drain electrode of the driving transistor DT, and the drain electrode is connected to the low-potential voltage line VL21. The first light-emission transistor ET1 is controlled based on a light-emission signal EM to provide a low-potential voltage VSS to the drain electrode of the driving transistor DT.

A second light-emission transistor ET2 includes a gate electrode, a source electrode, and a drain electrode. The gate electrode is connected to the light-emission line EL, the source electrode is connected to the other electrode of the capacitor Cst and the drain electrode of the first transistor T1, and the drain electrode is connected to the reference voltage line VL3. The second light-emission transistor ET2 is controlled based on the light-emission signal EM to provide the reference voltage Vref to the other electrode of the capacitor Cst and the drain electrode of the first transistor T1.

The source electrode and the drain electrode of each of the transistors as described above may be exchanged with each other depending on a type of the transistor or the applied voltage thereto.

Figure 5:
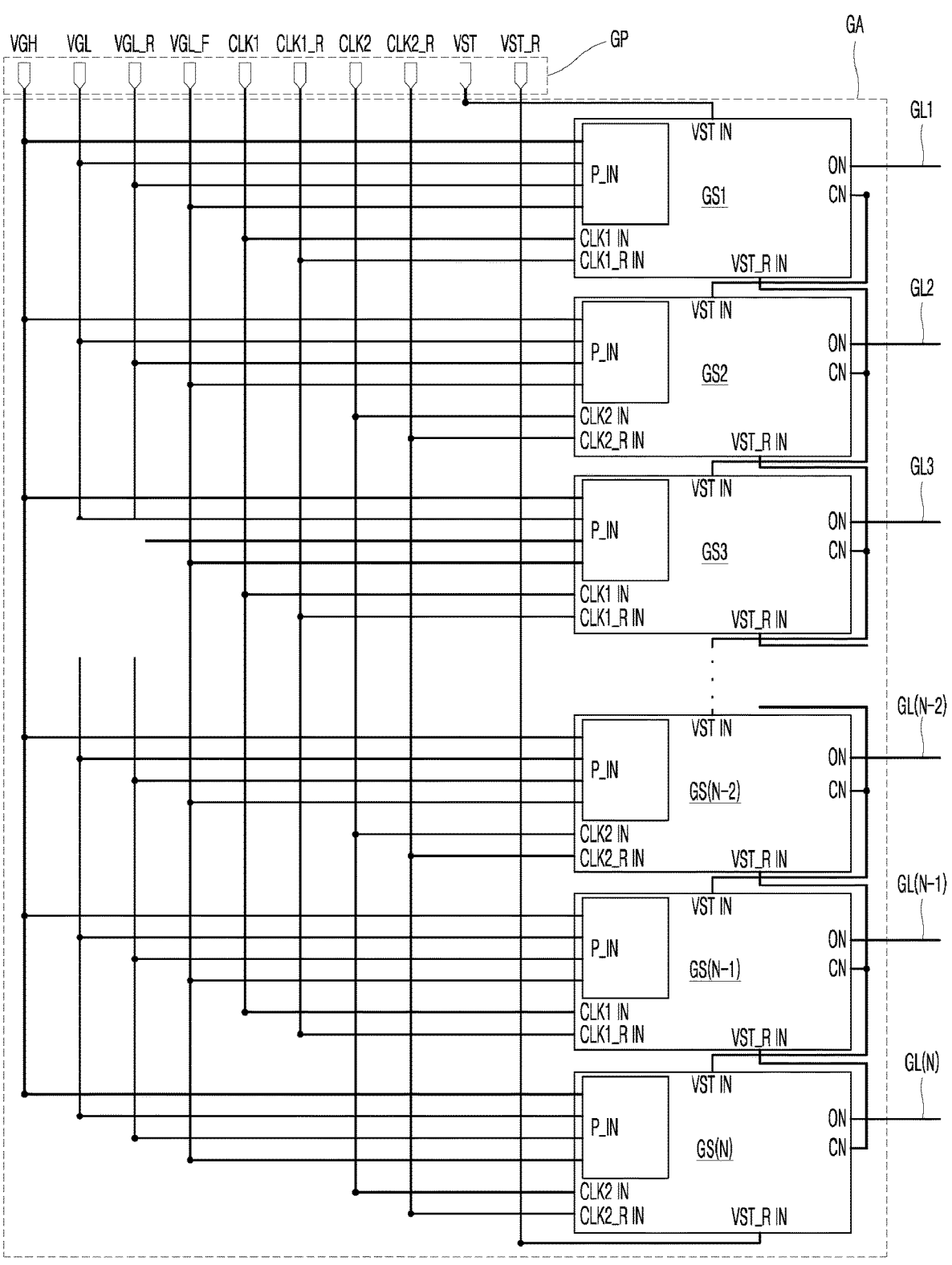
FIG. 5 is a block diagram showing a connection relationship of a gate driving circuit in a display device according to an aspect of the present disclosure.

FIG. 5 is a block diagram showing a connection relationship of the gate driving circuit in the display device according to one aspect of the present disclosure. FIG. 5 does not show a location of the gate driving circuit, but shows the connection relationship thereof to illustrate a configuration of the gate driving circuit.

Referring to FIG. 5, the gate driving circuit includes a plurality of stages GS1, GS2, GS3, . . . , GS(N−2), GS(N−1), and GS(N). The number of stages in the plurality of stages is N, and N is a natural number. Moreover, the gate driving circuit as shown in FIG. 5 may include the light-emission driving circuit.

A plurality of clock signal lines, a plurality of voltage lines, and a plurality of signal lines for driving the plurality of stages GS1, GS2, GS3, . . . , GS(N−2), GS(N−1), and GS(N) are disposed in the gate driving circuit area GA.

The plurality of clock signal lines may include a first clock signal line for providing a first clock signal CLK1, a first reverse clock signal line for providing a first reverse clock signal CLK1_R, a second clock signal line for providing a second clock signal CLK2, and a second reverse clock signal line for providing a second reverse clock signal CLK2_R.

The plurality of voltage lines may include a high voltage line for providing a high voltage VGH, a low voltage line for providing a low voltage VGL, a forward low voltage line for providing a forward low voltage VGL_F, and a reverse low voltage line for providing a reverse low voltage VGL_R.

The plurality of signal lines may include a forward start signal line for providing a forward start signal VST, a reverse start signal line for providing a reverse start signal VST_R, and a reset signal line for providing a reset signal.

The plurality of stages GS1, GS2, GS3, . . . , GS(N−2), GS(N−1), and GS(N), the plurality of clock signal lines, and the plurality of voltage lines may be disposed in the gate driving circuit area GA. The gate pads GP provide the signals may be respectively disposed at ends of the plurality of clock signal lines and the plurality of voltage lines.

Each of the plurality of stages GS1, GS2, GS3, . . . , GS(N−2), GS(N−1), and GS(N) includes a low power input node P_IN, and clock signal input nodes CLK1 IN, CLK1_R IN, CLK2 IN, and CLK2_R IN. The power input node P_IN includes a plurality of nodes which receive voltages from the plurality of voltage lines, respectively.

For example, when N is an even number, each of the odd number stages (e.g., GS1, GS3, . . . , GS(N−1)) may be connected to the first clock signal line that provides the first clock signal CLK1 and the first reverse clock signal line that provides the first reverse clock signal CLK1_R. Each of the even number stages (e.g., GS2, . . . , GS(N−2), and GS(N)) may be connected to the second clock signal line which provides the second clock signal CLK2, and to the second reverse clock signal line which provides the second reverse clock signal CLK2_R.

Each of the plurality of stages GS1, GS2, GS3, . . . , GS(N−2), GS(N−1), and GS(N) includes a start signal node VST IN that receives the start signal VST, and a reverse start signal node VST_R IN that receives the reverse start signal VST_R. In this case, the start signal node VST IN of the first stage GS1 is connected to the forward start signal line that provides the forward start signal VST, and the reverse start signal node VST_R IN of the N-th stage GS(N) is connected to the reverse start signal line which provides the reverse start signal VST_R. The start signal node VST IN of each of the second stage GS2 to (N−1)-th stage GS(N−1) is connected to a carry node CN of a previous stage thereto and receives a carry signal therefrom. Moreover, the reverse start signal node VST_R IN of each of the second stage GS2 to (N−1)-th stage GS(N−1) is connected to a carry node CN of a subsequent stage thereto and receives a carry signal therefrom.

An output node ON included in each of the plurality of stages GS1, GS2, GS3, . . . , GS(N−2), GS(N−1), and GS(N) is connected to the gate line and outputs the gate signal thereto. The first stage GS1 is connected to a first gate line GL1, the second stage GS2 is connected to a second gate line GL2, the third stage GS3 is connected to a third gate line GL3, . . . , the (N−2)-th stage GS(N−2) is connected a (N−2)-th gate line GL(N−2), the (N−1)-th stage GS(N−1) is connected to a (N−1)-th gate line GL(N−1), and the N-th stage GS(N) is connected to an N-th gate line GL(N). In this case, the gate line may be a light-emission line.

In the gate driving circuit according to one aspect of the present disclosure, the first stage GS1 to the N-th stage GS (N) may sequentially operate based on the start signal VST and thus output the gate signal. The N-th stage GS(N) to the first stage GS(N) may sequentially operate in a reverse manner based on the reverse start signal VST_R and thus output the gate signal. Accordingly, the gate driving circuit may operate in the bi-directional manner and a cost thereof may be reduced.

Figure 6:
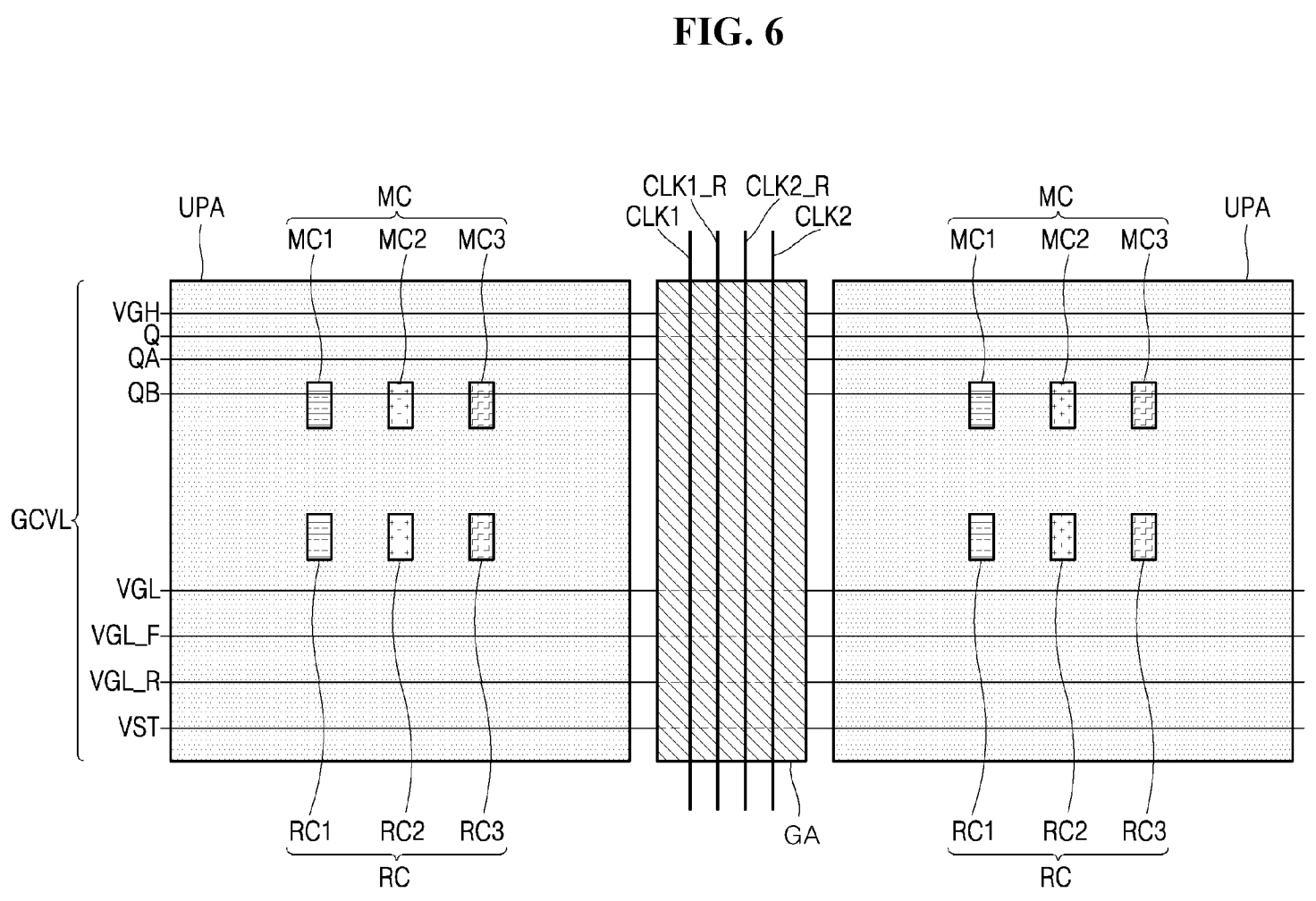

FIG. 6 is a diagram showing an arrangement of the unit pixel area UPA and the gate driving circuit area GA in a display device according to one aspect of the present disclosure.

FIG. 6 is an enlarged view of the display panel PN in FIG. 2, and shows two adjacent unit pixel areas UPA and the gate driving circuit area GA between the two adjacent unit pixel areas UPA. The main light-emitting elements MC and the auxiliary light-emitting elements RC are disposed in each unit pixel area UPA.

Referring to FIG. 5 and FIG. 6, the plurality of clock signal lines respectively providing the clock signals CLK1, CLK1_R, CLK2, and CLK2_R may extend in the column direction and may be arranged in the row direction and be disposed in the gate driving circuit area GA. Moreover, the plurality of voltage lines and node lines that provide the voltages VGH, VGL, VGL_F, VGL_R, and VST to the gate driving circuit may extend in the row direction and may be arranged in the column direction and may extend across the adjacent unit pixel areas UPA and the gate driving circuit area GA therebetween. In this case, the node lines may include a Q node line, a QA node line, and a QB node line connected to a Q node, a QA node, and a QB node included in the gate driving circuit, respectively. The node lines may be disposed only in a partial area of the display panel to electrically connect the gate driving circuits arranged in the distributed manner to each other.

The column direction and the row direction are different directions. The column direction and the row direction may be orthogonal to each other. However, the present disclosure is not limited thereto.

The plurality of clock signal lines, the plurality of voltage lines, and the plurality of node lines may be disposed to overlap the gate driving circuit area GA to electrically connect the gate driving circuits GC respectively disposed in the gate driving circuit areas GA to each other, and to provide the signals thereto.

Figure 7:
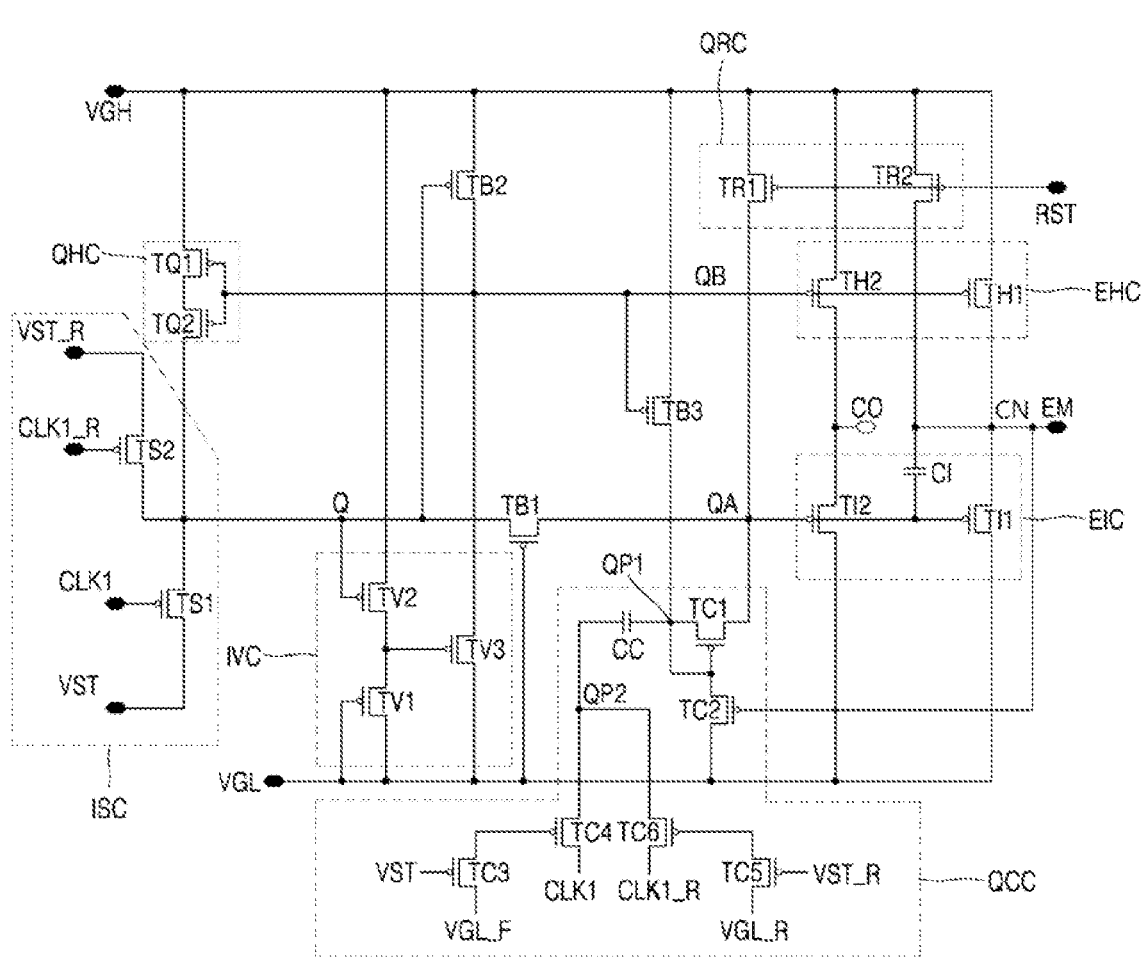
FIG. 7 is a circuit diagram showing a light-emission driving circuit according to an aspect of the present disclosure.

FIG. 7 is a circuit diagram showing a portion of a gate driving circuit according to one aspect of the present disclosure. More specifically, FIG. 7 is a circuit diagram showing a light-emission driving circuit according to one aspect of the present disclosure.

Referring to FIG. 7, to provide the light-emission signal EM to the light-emission line EL, the light-emission driving circuit according to one aspect of the present disclosure includes a light-emission signal holding circuit EHC, a light-emission signal input circuit EIC, a Q node reset circuit QRC, a Q node charging circuit QCC, an inverter circuit IVC, a Q node holding circuit QHC, an input signal separation circuit ISC, and a node buffer circuit.

The light-emission driver may include a plurality of light-emission driving circuits respectively disposed in the plurality of gate driving circuit areas GA. Specifically, the plurality of light-emission driving circuits may be respectively disposed in the plurality of gate driving circuit areas GA arranged in the row where the light-emission line EL to which the light-emission signal EM provided from the light-emission driving circuit is applied extends.

Referring to FIG. 5 and FIG. 7, the light-emission driving circuit may be included in one stage of the plurality of stages GS1, GS2, GS3, . . . , GS(N−2), GS(N−1), and GS(N). In FIG. 7, an example in which the light-emission driving circuit is included in each of the odd-numbered stages GS1, GS3, . . . , and GS(N−1) is described. The light-emission driving circuit included in each of the even-numbered stages GS2, . . . , GS(N−2), and GS(N) may be implemented by converting the first clock signal CLK1 to the second clock signal CLK2 in the circuit in FIG. 7.

The light-emission driving circuit may operate based on the high voltage VGH, the low voltage VGL, the forward low voltage VGL_F, the reverse low voltage VGL_R, the start signal VST, the reverse start signal VST_R, the reset signal RST, the first clock signal CLK1 and the first reverse clock signal CLK1_R.

An example in which each of transistors included in the light-emission driving circuit is configured as a thin-film transistor with a gate electrode, a first source/drain electrode, and a second source/drain electrode, and is configured as a P-type transistor is described. The P-type transistor is turned on when a low voltage is applied to the gate electrode, and is turned off when a high voltage is applied to the gate electrode.

The thin-film transistor may additionally include an active layer, and the active layer may be made of a semiconductor material such as oxide semiconductor, amorphous silicon, or polysilicon. However, the present disclosure is not limited thereto. Moreover, one of the first source/drain electrode and the second source/drain electrode may be a source electrode and the other thereof may be a drain electrode.

The light-emission signal holding circuit EHC may maintain each of the light-emission signal EM and the carry signal CO as a turn-off signal during a remaining period excluding a period during which the light-emitting element LC emits light. The turn-off signal refers to a signal that may turn off the transistor connected to the light-emission signal line in the pixel circuit.

The light-emission signal holding circuit EHC includes a first holding transistor TH1 and a second holding transistor TH2. A gate electrode of each of the first holding transistor TH1 and the second holding transistor TH2 is connected to the QB node, and a first source/drain electrode thereof is connected to the high voltage line from which the high voltage VGH is provided. Moreover, a second source/drain electrode of the first holding transistor TH1 is connected to the output node ON (in FIG. 5) from which the light-emission signal EM is output, and a second source/drain electrode of the second holding transistor TH2 is connected to the carry node CN (in FIG. 5) from which the carry signal CO is output.

The first holding transistor TH1 provides the high voltage VGH to the output node so that the light-emission signal EM may be maintained at the high voltage VGH. For example, referring to FIG. 4, when the light-emission signal EM is at the high voltage VGH, the first light-emission transistor ET1 and the second light-emission transistor ET2 are turned off to maintain a state in which the emitting element LC does not emit light.

The second holding transistor TH2 provides the high voltage VGH to the carry node, so that the carry signal CO may be maintained at the high voltage VGH.

The light-emission signal input circuit EIC may maintain each of the light-emission signal EM and the carry signal CO as a turn-on signal during the period during which the light-emitting element LC emits light. The turn-on signal refers to a signal that may turn on the transistor connected to the light-emission signal line in the pixel circuit.

The light-emission signal input circuit EIC includes a first input transistor TI1, a second input transistor TI2, and an input capacitor C1. A gate electrode of each of the first input transistor TI1 and the second input transistor TI2 is connected to the QA node, and a first source/drain electrode thereof is connected to the low voltage line from which the low voltage VGL is provided. Moreover, a second source/drain electrode of the first input transistor TI1 is connected to the output node ON (in FIG. 5) from which the light-emission signal EM is output, and a second source/drain electrode of the second input transistor TI2 is connected to the carry node CN (in FIG. 5) from which the carry signal CO is output.

The first input transistor TI1 provides the low voltage VGL to the output node, so that the light-emission signal EM may be maintained at the low voltage VGH. For example, referring to FIG. 4, when the light-emission signal EM is at the low voltage VGL, the first light-emission transistor ET1 and the second light-emission transistor ET2 are turned on such that the light-emitting element LC may emit light.

The second input transistor TI2 provides the low voltage VGL to the carry node, so that the carry signal CO may be maintained at the low voltage VGL. The carry signal CO may be provided as the start signal VST to a next stage or may be provided as the reverse start signal VST_R to a previous stage such that the stages sequentially operate.

A first electrode of the input capacitor C1 is connected to the gate electrode of the first input transistor TI1, and a second electrode thereof is connected to the output node from which the light-emission signal EM is output, and to the second source/drain electrode of the first input transistor TI1. When the first input transistor TI1 is turned on, the input capacitor C1 may bootstrap the QA node to maintain the output of the light-emission signal EM.

The node buffer circuit includes the first buffer transistor TB1, the second buffer transistor TB2, and the third buffer transistor TB3. A gate electrode of the first buffer transistor TB1 is connected to the low voltage line, a first source/drain electrode thereof is connected to the QA node, and a second source/drain electrode thereof is connected to the Q node. The first buffer transistor TB1 may be maintained at a turned-on state based on the low voltage VGL such that the QA node and the Q node are electrically connected to each other. Conversely, when the QA node is bootstrapped, the first buffer transistor TB1 breaks the electrical connection between the QA node and the Q node, so that a voltage between the first and second source/drain electrodes of each of the transistors connected to the Q node is prevented from increasing to a value greater than or equal to a threshold value. Limiting the voltage at the Q node prevents a breakdown phenomenon of each of the transistors connected to the Q node and prevents destruction of the transistors connected at the Q node.

A gate electrode of the second buffer transistor TB2 is connected to the Q node, a first source/drain electrode thereof is connected to the high voltage line, and a second source/drain electrode thereof is connected to the QB node. The second buffer transistor TB2 is turned on based on the voltage of the Q node to provide the high voltage VGH to the QB node. Accordingly, when the Q node is at the low voltage, the second buffer transistor TB2 may provide the high voltage to the QB node to turn off the light-emission signal holding circuit EHC.

A gate electrode of the third buffer transistor TB3 is connected to the QB node, a first source/drain electrode thereof is connected to the high voltage line, and a second source/drain electrode thereof is connected to a QP1 node. The third buffer transistor TB3 is turned on based on a voltage of the QB node to provide the high voltage VGH to the QP1 node. The QP1 node will be described below in detail with reference to the Q node charging circuit QCC.

The Q node charging circuit QCC is connected to a QA node and charges the QA node. Specifically, to output the light-emission signal EM as the turn-on signal, the Q node charging circuit QCC continuously charges the QA node such that the voltage of the QA node is maintained as a turn-on voltage, in this example, a low voltage. The Q node charging circuit QCC includes a first charging transistor TC1, a second charging transistor TC2, a third charging transistor TC3, a fourth charging transistor TC4, a fifth charging transistor TC5, a sixth charging transistor TC6, and a charging capacitor CC.

A first source/drain electrode of the first charging transistor TC1 is connected to the QA node. A gate electrode and a second source/drain electrode are electrically connected to each other. Thus, the first charging transistor TC1 acts as a diode so that the low voltage may be charged to the QA node whenever the first clock signal CLK1 or the first reverse clock signal CLK1_R is input thereto.

A gate electrode of the second charging transistor TC2 is connected to the output node, a first source/drain electrode thereof is connected to the low voltage line, and a second source/drain electrode thereof is connected to the gate electrode of the first charging transistor TC1. The second charging transistor TC2 provides the low voltage VGL to the gate electrode of the first charging transistor TC1 according to the light-emission signal EM, thereby turning on or turning off the first charging transistor TC1.

A first electrode of the charging capacitor CC is connected to the QP1 node and a second electrode thereof is connected to a QP2 node. The charging capacitor CC is disposed between and connected to the QP1 node and the QP2 node to preserve the charges so that the first charging transistor TC1 may charge the QA node.

A gate electrode of the third charging transistor TC3 is connected to the forward start signal line, a first source/drain electrode thereof is connected to the forward low voltage line, and a second source/drain electrode thereof is connected to a gate electrode of the fourth charging transistor TC4. Moreover, a first source/drain electrode of the fourth charging transistor TC4 is connected to the first clock signal line, and a second source/drain electrode thereof is connected to the QP2 node.

When sequentially operating the stages in the forward manner, the third charging transistor TC3 is turned on based on the start signal VST to transfer the forward low voltage VGL_F to the fourth charging transistor TC4 to turn on the fourth charging transistor TC4. Thus, the fourth charging transistor TC4 is turned on to apply the first clock signal CLK1 to the QP2 node.

A gate electrode of the fifth charging transistor TC5 is connected to the reverse start signal line, a first source/drain electrode thereof is connected to the reverse low voltage line, and a second source/drain electrode thereof is connected to a gate electrode of the sixth charging transistor TC6. Moreover, a first source/drain electrode of the sixth charging transistor TC6 is connected to the first reverse clock signal line, and a second source/drain electrode thereof is connected to the QP2 node.

When sequentially operating the stages in the reverse manner, the fifth charging transistor TC5 is turned on based on the reverse start signal VST_R to transfer the reverse low voltage VGL_R to the sixth charging transistor TC6 to turn on the sixth charging transistor TC6. The sixth charging transistor TC6 is turned on to apply the first reverse clock signal CLK1_R to the QP2 node. In this case, the third charging transistor TC3 and the fourth charging transistor TC4 are in a turned-off state.

The Q node holding circuit QHC may maintain the Q node at the high voltage when the QB node is at the low voltage. In other words, the Q node holding circuit QHC may maintain the Q node at the high voltage during a period during which the light-emitting element LC does not emit light.

The Q node holding circuit QHC includes a first Q node holding transistor TQ1 and a second Q node holding transistor TQ2. Gate electrodes of the first Q node holding transistor TQ1 and the second Q node holding transistor TQ2 are connected to the QB node. A first source/drain electrode of the first Q node holding transistor TQ1 is connected to the high voltage line, and a first source/drain electrode of the second Q node holding transistor TQ2 is connected to the Q node. Moreover, a second source/drain electrode of the first Q node holding transistor TQ1 and a second source/drain electrode of the second Q node holding transistor TQ2 are connected to each other. The first Q node holding transistor TQ1 and the second Q node holding transistor TQ2 have a structure in which they are connected in series to each other and are controlled based on a voltage of the QB node to apply the high voltage VGH to the Q node.

The Q node reset circuit QRC provides the high voltage VGH to the QA node and the output node ON to reset the QA node and the output node ON, thereby removing a residual current remaining in the QA node and the output node ON, and thus preventing abnormal operation after a frame starts. The Q node reset circuit QRC includes a first reset transistor TR1 and a second reset transistor TR2.

A gate electrode of each of the first reset transistor TR1 and the second reset transistor TR2 is connected to the reset signal line from which the reset signal RST is provided, and a first source/drain electrode thereof is connected to the high voltage line. A second source/drain electrode of the first reset transistor TR1 is connected to the QA node, and a second source/drain electrode of the second reset transistor TR2 is connected to the output node ON. The first reset transistor TR1 is turned on based on the reset signal RST to apply the high voltage VGH to the QA node to reset the QA node. The second reset transistor TR2 is turned on based on the reset signal RST to apply the high voltage VGH to the output node ON to reset the output node ON.

The inverter circuit IVC allows the QB node to be maintained at the high voltage when the Q node is at the low voltage. The inverter circuit IVC applies the low voltage to the QB node when the Q node is at the high voltage. The inverter circuit IVC includes a first inverting transistor TV1, a second inverting transistor TV2, and a third inverting transistor TV3.

A gate electrode and a first source/drain electrode of the first inverting transistor TV1 are connected to the low voltage line. A gate electrode of the second inverting transistor TV2 is connected to the Q node, and a first source/drain electrode thereof is connected to the high voltage line. A second source/drain electrode of the first inverting transistor TV1 is connected to a second source/drain electrode of the second inverting transistor TV2.

A gate electrode of the third inverting transistor TV3 is connected to the second source/drain electrode of the first inverting transistor TV1 and the second source/drain electrode of the second inverting transistor TV2. A first source/drain electrode of the third inverting transistor TV3 is connected to the low voltage line and a second source/drain electrode thereof is connected to the QB node.

The first inverting transistor TV1 is always maintained at a turned-on state based on the low voltage VGL, such that the low voltage VGL is applied to the gate electrode of the third inverting transistor TV3.

When the Q node is at the low voltage, the second inverting transistor TV2 is turned on to apply the high voltage VGH to the gate electrode of the third inverting transistor TV3 to turn off the third inverting transistor TV3. Thus, the QB node is maintained at the high voltage VGH. When the Q node is at the high voltage, the second inverting transistor TV2 is turned off, and the third inverting transistor TV3 is turned on in response to the first inverting transistor TV1 being turned on. The turned-on third inverting transistor TV3 provides the low voltage VGL to the QB node.

When the Q node is at the low voltage VGH, the inverter circuit IVC together with the second buffer transistor TB2 allows the QB node to have the high voltage VGH and to be maintained at the high voltage VGH.

The input signal separation circuit ISC applies, to the Q node, a signal for causing the light-emission driving circuit to perform the forward operation and a signal for causing the light-emission driving circuit to perform the reverse operation in a separate manner from each other.

The input signal separation circuit ISC includes a first separation transistor TS1 and a second separation transistor TS2.

The first separation transistor TS1 is configured for the forward operation. A gate electrode of the first separation transistor TS1 is connected to the first clock signal line, and a first source/drain electrode thereof is connected to the forward start signal line. A second source/drain electrode of the first separation transistor TS1 is connected to the Q node.

During the forward operation of the light-emission driving circuit, the first separation transistor TS1 is turned on based on the first clock signal CLK1 to provide the start signal VST to the Q node. Specifically, the first separation transistor TS1 is turned on to provide the low voltage of the start signal VST to the Q node to allow the light-emission signal EM to be outputted.

The second separation transistor TS2 is configured for the reverse operation. A gate electrode of the second separation transistor TS2 is connected to the first reverse clock signal line, a first source/drain electrode thereof is connected to the reverse start signal line, and a second source/drain electrode thereof is connected to the Q node. During the reverse operation of the light-emission driving circuit, the second separation transistor TS2 is turned on based on the first reverse clock signal CLK1_R to provide the reverse start signal VST_R to the Q node. Specifically, the second separation transistor TS2 is turned on to provide the low voltage of the reverse start signal VST_R to the Q node to allow the light-emission signal EM to be outputted.

Like the Q node holding circuit QHC, each of the first separation transistor TS1 and the second separation transistor TS2 of the input signal separation circuit ISC may be implemented to have a structure in which two transistors are connected in series to each other. Thus, reliability of the Q node may be secured.

The light-emission driving circuit according to one aspect of the present disclosure includes the light-emission signal holding circuit EHC, the light-emission signal input circuit EIC, the Q node reset circuit QRC, the Q node charging circuit QCC, the inverter circuit IVC, the Q node holding circuit QHC, the input signal separation circuit ISC, and the node buffer circuit TB1, TB2, and TB3. Thus, the light-emission driving circuit may perform the bi-directional operation (forward operation and reverse operation).

Figure 8:
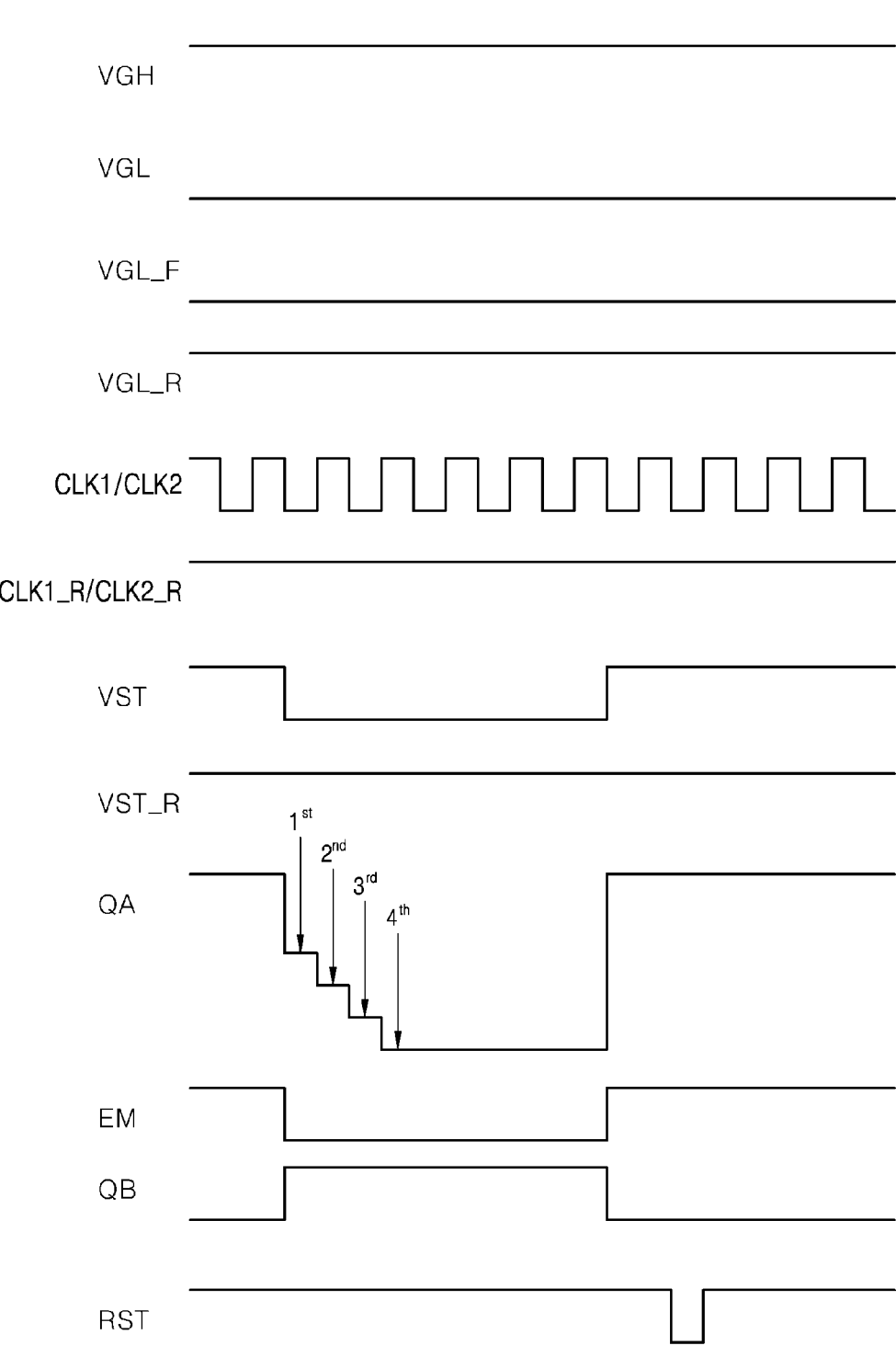
FIG. 8 is a waveform diagram showing a forward operation of a light-emission driving circuit according to an aspect of the present disclosure.
Figure 9:
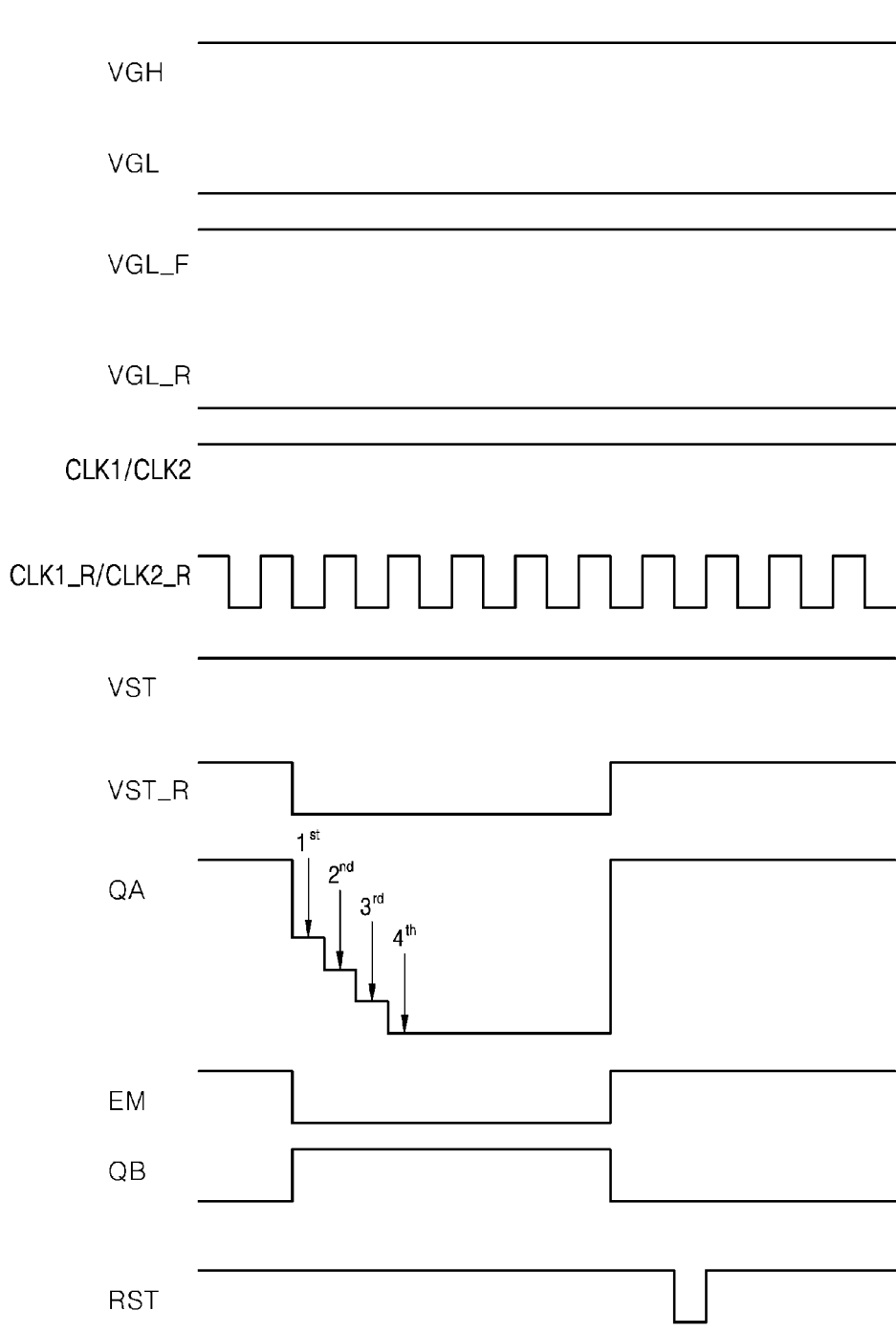
FIG. 9 is a waveform diagram showing a reverse operation of a light-emission driving circuit according to an aspect of the present disclosure.

FIG. 8 is a waveform diagram showing the forward operation of the light-emission driving circuit according to one aspect of the present disclosure. FIG. 9 is a waveform diagram showing the reverse operation of the light-emission driving circuit according to one aspect of the present disclosure. Specifically, FIG. 8 and FIG. 9 show the waveforms input to the light-emission driving circuit in FIG. 7.

Referring to FIG. 8 and FIG. 9, the high voltage VGH and the low voltage VGL as a fixed voltage are applied to the light-emission driving circuit, and the high voltage VGH is higher than the low voltage VGL. Each of the high voltage VGH and the low voltage VGL is maintained at a fixed level during each of the forward and the reverse operation. Each of the voltages other than the high voltage VGH and the low voltage VGL as described below may vary depending on the operation direction of the light-emission driving circuit.

Referring to FIG. 8, the voltages provided to the light-emission driving circuit when the light-emission driving circuit operates in the forward direction are described.

The forward low voltage VGL_F is at a low level voltage, and the reverse low voltage VGL_R is at a high level voltage. In this case, setting the reverse low voltage VGL_R to the high level voltage may prevent the light-emission driving circuit from operating in the reverse direction due to the reverse low voltage VGL_R.

The clock signals CLK1 and CLK2 are a forward clock signal with a certain period, signal magnitude, and duty ratio, that is, a clock signal that cycles between the low level voltage and the high level voltage. The reverse clock signals CLK1_R and CLK2_R are a constant voltage signal. In this case, the reverse clock signals CLK1_R and CLK2_R may be at a high level voltage. Setting the reverse clock signals CLK1_R and CLK2_R to the high level voltage may allow one of the transistors of the input signal separation circuit ISC to which the reverse clock signals CLK1_R and CLK2_R is applied to be turned off, thereby preventing the light-emission driving circuit from operating in the reverse direction.

The start signal VST is the forward start signal, and is a pulse signal with a predefined period and magnitude. The reverse start signal VST_R is a constant voltage. In this case, the pulse of the forward start signal may be at a low level voltage, and the reverse start signal VST_R may be at a high level voltage. Setting the reverse start signal VST_R to the high level voltage may allow some of the transistors of the Q node charging circuit QCC to which the reverse start signal VST_R is provided to be turned off, thereby preventing the light-emission driving circuit from operating in the reverse direction.

Referring to the voltage change of the QA node included in the light-emission driving circuit, multiple charging stages are performed to maintain the voltage of the QA node as the turn-on voltage. In this case, the Q node charging circuit QCC charges the QA node four times. In a first charging stage 1st, the voltage of the QA node is changed from a high voltage to a low voltage based on the start signal VST provided to the Q node charging circuit QCC. In a second charging stage 2nd to a fourth charging stage 4th, whenever the first clock signal CLK1 is input thereto, the QA node is charged to a lower voltage based on the forward low voltage VGL_F. The number of the charging times is not limited thereto and may vary.

Referring to FIG. 9, the voltages provided to the light-emission driving circuit when the light-emission driving circuit operates in the reverse manner are described.

The forward low voltage VGL_F is at a high level voltage, and the reverse low voltage VGL_R is at a low level voltage. In this case, setting the forward low voltage VGL_F to the high level voltage may allow the light-emission driving circuit to be prevented from operating in the forward direction due to the forward low voltage VGL_F.

The clock signals CLK1 and CLK2 are a forward clock signal and is a constant voltage signal. The reverse clock signals CLK1_R and CLK2_R have a certain period, signal magnitude, and duty ratio, that is, a clock signal that cycles between the low level voltage and the high level voltage. In this case, the forward clock signal may be at a high level voltage. Setting the forward clock signal to the high level voltage may allow one of the transistors of the input signal separation circuit ISC to which the clock signal CLK1 and CLK2 is provided to be turned off such that the light-emission driving circuit may be prevented from operating in the forward direction.

The start signal VST is a forward start signal and has a constant voltage level, and the reverse start signal VST_R is a pulse signal with a preset period and magnitude. In this case, the pulse of the reverse start signal may be at a low level voltage, and the forward start signal may be at a high level voltage. Setting the forward start signal to the high level voltage may allow some of the transistors of the Q node charging circuit QCC to be turned off and prevent the light-emission driving circuit from operating in the forward manner.

Referring to the voltage change of the QA node included in the light-emission driving circuit, multiple charging stages are performed to maintain the voltage of the QA node as the turn-on voltage. In this case, the Q node charging circuit QCC charges the QA node four times. In a first charging stage 1st, the voltage of the QA node is changed from a high voltage to a low voltage based on the reverse start signal VST_R provided to the Q node charging circuit QCC. In a second charging stage 2nd to a fourth charging stage 4th, whenever the first reverse clock signal CLK1_R is input thereto, the QA node is charged to a lower voltage based on the reverse low voltage VGL_R. The number of the charging times is not limited thereto and may vary.

The low level voltage as mentioned above may be the same as the low voltage VGL. The high level voltage as mentioned above may be the same as the high voltage VGH.

FIG. 8 and FIG. 9 illustrates the voltages of the QA node and the QB node, and the waveform of the light-emission signal EM based on the voltages and the signals provided to the light-emission driving circuit. The light-emission driving circuit outputs the same light-emission signal EM in both the forward and reverse operations. Moreover, in both the forward and reverse operations, the reset signal RST is provided to the light-emission driving circuit after the output of the light-emission signal EM and before the end of the frame, thereby preventing abnormal operation due to the residual current during a next frame thereto. The reset signal RST is provided thereto after the output of the light-emission signal EM of the light-emission driving circuit to accurately output a next light-emission signal thereto, thereby operating the Q node reset circuit QRC to reset the QA node and the output node.

Figure 10:
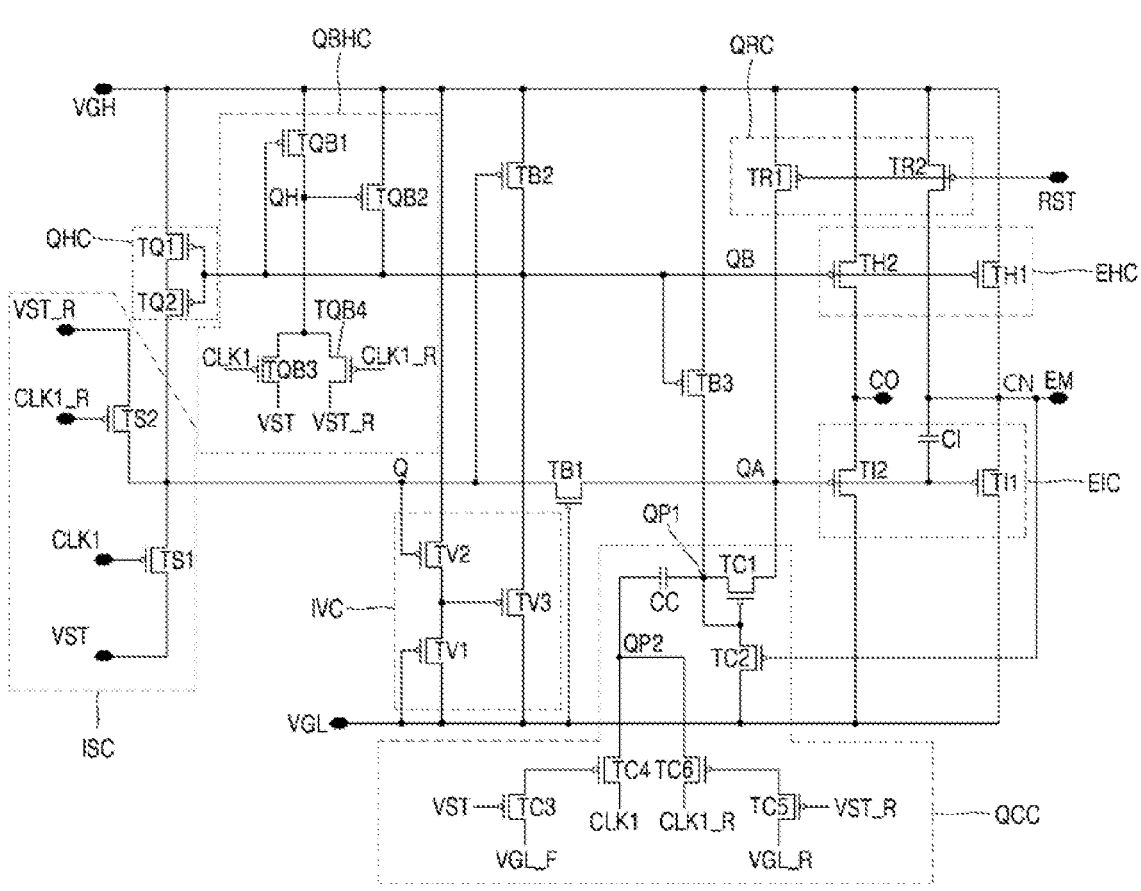
FIG. 10 is a circuit diagram showing a light-emission driving circuit according to another aspect of the present disclosure.

FIG. 10 is a circuit diagram showing a portion of a gate driving circuit according to another aspect of the present disclosure. More specifically, FIG. 10 is a circuit diagram showing a light-emission driving circuit according to another aspect of the present disclosure.

Moreover, the circuit in FIG. 10 further includes a QB node holding circuit in the light-emission driving circuit of FIG. 7, and thus the descriptions of the same components as those in FIG. 7 is simplified or omitted.

Referring to FIG. 10, the light-emission driving circuit according to another aspect of the present disclosure includes the light-emission signal holding circuit EHC, the light-emission signal input circuit EIC, the Q node reset circuit QRC, the Q node charging circuit QCC, the inverter circuit IVC, the Q node holding circuit QHC, the input signal separation circuit ISC, the node buffer circuit, and a QB node holding circuit QBHC.

The QB node holding circuit QBHC may maintain the QB node at the high voltage when the Q node is at the low voltage. In other words, the QB node holding circuit QBHC may maintain the QB node at the high voltage during the period during which the light-emitting element LC emits light, such that the light-emission signal EM of the low voltage may be stably output.

The QB node holding circuit QBHC includes a first QB node holding transistor TQB1, a second QB node holding transistor TQB2, a third QB node holding transistor TQB3, and a fourth QB node holding transistor TQB4.

A gate electrode of the first QB node holding transistor TQB1 is connected to the QB node, a first source/drain electrode thereof is connected to the high voltage line, and a second source/drain electrode thereof is connected to a QH node. The first QB node holding transistor TQB1 is controlled based on the voltage of the QB node to provide the high voltage VGH to the QH node.

A gate electrode of the second QB node holding transistor TQB2 is connected to the QH node, a first source/drain electrode thereof is connected to the high voltage line, and a second source/drain electrode thereof is connected to the QB node. The second QB node holding transistor TQB2 is controlled based on the voltage of the QH node to provide high voltage VGH to the QB node.

The voltage of the QH node is controlled by the third QB node holding transistor TQB3 and the fourth QB node holding transistor TQB4.

A gate electrode of the third QB node holding transistor TQB3 is connected to the first clock signal line, a first source/drain electrode thereof is connected to the forward start signal line, and a second source/drain electrode thereof is connected to the QH node. Moreover, a gate electrode of the fourth QB node holding transistor TQB4 is connected to the first reverse clock signal line, a first source/drain electrode thereof is connected to the reverse start signal line, and a second source/drain electrode thereof is connected to the QH node.

When the light-emission driving circuit operates in the forward direction, the third QB node holding transistor TQB3 is turned on based on the first clock signal CLK1 to apply the start signal VST to the QH node, such that the second QB node holding transistor TQB2 is turned on to apply the high voltage VGH to the QB node. In this case, the first QB node holding transistor TQB1 and the fourth QB node holding transistor TB4 are in the turned-off state.

When the light-emission driving circuit performs the reverse operation, the fourth QB node holding transistor TQB4 is turned on based on the first reverse clock signal CLK1_R to apply the reverse start signal VST_R to the QH node, such that the second QB node holding transistor TQB2 is turned on to apply the high voltage VGH to the QB node. In this case, the first QB node holding transistor TQB1 and the third QB node holding transistor TQB3 are in the turned-off state.

In both the forward and reverse operations, when the light-emission driving circuit outputs the light-emission signal EM of the low voltage, that is, when the Q node is at the low voltage, the QB node is at the high voltage VGH, so that the first QB node holding transistor TQB1 is turned off. On the contrary, in both the forward and reverse operations, when the light-emission driving circuit outputs the light-emission signal EM of the high voltage, that is, when the QB node is at the low voltage, the first QB node holding transistor TQB1 is turned on.

Aspects of the display device of the present disclosure may be described as follows.

According to a first aspect of the display device, the plurality of light-emission driving line include a high voltage line, a low voltage line, a reverse low voltage line, and a node line, According to the first aspect, the node line includes a QB node line and a QA node line, wherein the light-emission driving circuit includes a light-emission signal holding circuit connected to the QB node line and a light-emission signal input circuit connected to the QA node line.

According to the first aspect, the light-emission driving circuit further includes: an output node to the light-emission signal holding circuit and the light-emission signal input circuit; and a carry node connected to the light-emission signal holding circuit and the light-emission signal input circuit, wherein the output node is connected to the light-emission line, wherein the carry node is connected to another light-emission driving circuit previous or subsequent to the light-emission driving circuit in the column direction.

According to the first aspect, the plurality of clock signal line include a forward clock signal line and a reverse clock signal line, wherein the plurality of light-emission driving line include a start signal line and a reverse start signal line.

According to the first aspect, the light-emission driving circuit includes: an input transistor disposed between and connected to an output node connected to the light-emission line and a low voltage line; a first separation transistor including a gate electrode connected to the forward clock signal line, wherein the first separation transistor is disposed between and connected to the forward start signal line and a gate electrode of the input transistor; and a second separation transistor including a gate electrode connected to the reverse clock signal line, wherein the second separation transistor is disposed between and connected to the reverse start signal line and the gate electrode of the input transistor.

According to the first aspect, the light-emission driving circuit includes: a holding transistor disposed between and connected to an output node connected to the light-emission line and a high voltage line; a first QB holding transistor disposed between and connected to the high voltage line and a QH node, wherein the first QB holding transistor is connected to a gate electrode of the holding transistor; a second QB holding transistor disposed between and connected to the high voltage line and the gate node of the holding transistor, wherein the second QB holding transistor is connected to the QH node; a third QB node holding transistor including a gate electrode connected to the forward clock signal line, wherein the third QB node holding transistor is disposed between and connected to the forward start signal line and the QH node; and a fourth QB node holding transistor including a gate electrode connected to the reverse clock signal line, wherein the fourth QB node holding transistor is disposed between and connected to the reverse start signal line and the QH node.

According to the first aspect, the light-emission driving circuit includes: an input transistor disposed between and connected to an output node connected to the light-emission line and a low voltage line; a first charging transistor including a first source/drain electrode connected to a gate electrode of the input transistor, a gate electrode, and a second source/drain electrode connected to the gate electrode thereof; a second charging transistor disposed between and connected to the gate electrode of the first charging transistor and the low voltage line, wherein the second charging transistor includes a gate electrode connected to the output node; and a charging capacitor including a first electrode connected to the second source/drain electrode of the first charging transistor, and a second electrode connected to a QP node.

According to the first aspect, the plurality of light-emission driving lines further includes a forward low voltage line and a reverse low voltage line, wherein the light-emission driving circuit includes: a third charging transistor disposed between and connected to the QP node and the clock signal line; a fourth charging transistor disposed between and connected to the QP node and the reverse clock signal line; a fifth charging transistor disposed between and connected to a gate electrode of the third charging transistor and the forward low voltage line, wherein the fifth charging transistor includes a gate electrode connected to the start signal line; and a sixth charging transistor disposed between and connected to a gate electrode of the fourth charging transistor and the reverse low voltage line, wherein the sixth charging transistor includes a gate electrode connected to the reverse start signal line.

A second aspect of the present disclosure provides a display device comprising: a substrate including a pixel area including a plurality of sub-pixels and a non-pixel area surrounding the pixel area; a data pad and a gate pad disposed on one surface of the substrate and in the non-pixel area; a gate driving circuit disposed between two adjacent pixel areas in the non-pixel area and electrically connected to the gate pad; a data line disposed on the substate and in the pixel area and the non-pixel area and connected to the data pad; a clock signal line electrically connected to the gate driving circuits arranged in a column direction and connected to the gate pad; a gate line disposed on the substrate and extending in a row direction; and a plurality of light-emitting elements disposed on the substrate, wherein the gate driving circuits arranged in the row direction are electrically connected to each other to provide a gate signal to the gate line.

According to the second aspect, the display device further comprises: a first power line disposed in the non-pixel area and between two adjacent pixel areas; and second power lines respectively disposed on both opposing sides of the gate driving circuit and disposed in the non-pixel area.

According to the second aspect, the display device further comprises: a first power line pad disposed in the non-pixel area and connected to the first power line; and a second power line pad disposed in the non-pixel area and connected to the second power line, wherein the first power line pad, the gate pad, and the data pad are disposed on a first surface of the substrate, wherein the second power line pad is disposed on a second surface opposite to the first surface of the substrate.

According to the second aspect, the display device further comprises an alignment key disposed between the gate driving circuits adjacent to each other in the column direction and in the non-pixel area.

According to the second aspect, at least two light-emitting elements are disposed in the pixel area, wherein each of the light-emitting elements is configured as a micro-LED.

According to the second aspect, the pixel area is a unit pixel area and includes four sub-pixels, wherein each of the four sub-pixels includes a pixel circuit including a driving transistor, wherein in the unit pixel area, two of a pair of red light-emitting elements, a pair of green light-emitting elements, and a pair of blue light-emitting elements electrically connected to the pixel circuits are disposed.

According to the second aspect, the clock signal line includes a forward clock signal line and a reverse clock signal line.

According to the second aspect, the gate driving circuit includes a light-emission driving circuit, wherein the light-emission driving circuit includes a light-emission signal holding circuit, a light-emission signal input circuit, a Q node reset circuit, a Q node charging circuit, an inverter circuit, a Q node holding circuit, and an input signal separation circuit.

According to the second aspect, the light-emission driving circuit further includes a QB node holding circuit.

According to the second aspect, each of the light-emission signal holding circuit and the light-emission signal input circuit outputs a light-emission signal and a carry signal, wherein each of the Q node charging circuit and the input signal separation circuit is connected to the forward clock signal line and the reverse clock signal line.

Although the aspects of the present disclosure have been described in more detail with reference to the accompanying drawings, the present disclosure is not necessarily limited to these express descriptions and may be modified in a various manner in the scope of the technical spirit of the present disclosure. Accordingly, the aspects as disclosed in the present disclosure are intended to describe rather than limit the technical idea of the present disclosure, and the scope of the technical idea of the present disclosure is not limited by these embodiments. Therefore, it should be understood that the aspects described above are not restrictive but illustrative in all respects.

What is claimed is:

1. A display device comprising:
a substrate including a plurality of pixel areas and a plurality of gate driving circuit areas, wherein each of the plurality of gate driving circuit areas is disposed between adjacent pixel areas;
a plurality of pixel circuits respectively disposed in the plurality of pixel areas;
a plurality of light-emission driving circuits respectively disposed in the plurality of gate driving circuit areas and electrically connected to the plurality of pixel circuits;
a light-emission line disposed on the substrate and extending in a row direction, and connected to the plurality of pixel circuits arranged in the row direction;
a plurality of light-emission driving lines disposed on the substrate and extending in the row direction, wherein a light-emission driving line is connected to a corresponding light-emission driving circuit;
a plurality of clock signal lines disposed on the substrate and extending in a column direction, wherein the plurality of clock signal lines are disposed in each of the plurality of gate driving circuit areas and connected to the plurality of light-emission driving circuits; and
a plurality of light-emitting elements disposed in each of the plurality of pixel areas and connected to the plurality of pixel circuits,
wherein the plurality of light-emission driving lines include a high voltage line, a low voltage line, a forward low voltage line, a reverse low voltage line, and a node line.

2. The display device of claim 1, wherein the plurality of light-emission driving circuits arranged in the row direction are electrically connected to each other via the plurality of light-emission driving lines.

3. The display device of claim 1, wherein the node line includes a QB node line and a QA node line connected to a QA node and a QB node included in the plurality of light-emission driving circuits respectively,
wherein the light-emission driving circuit includes a light-emission signal holding circuit connected to the QB node line and a light-emission signal input circuit connected to the QA node line.

4. The display device of claim 3, wherein the light-emission driving circuit further includes:
an output node connected to the light-emission signal holding circuit and the light-emission signal input circuit; and
a carry node connected to the light-emission signal holding circuit and the light-emission signal input circuit,
wherein the output node is connected to the light-emission line,
wherein the carry node is connected to another light-emission driving circuit previous or subsequent to the light-emission driving circuit in the column direction.

5. The display device of claim 1, wherein the plurality of clock signal lines include a forward clock signal line and a reverse clock signal line,
wherein the plurality of light-emission driving lines include a forward start signal line and a reverse start signal line.

6. The display device of claim 5, wherein the light-emission driving circuit includes:

an input transistor disposed between and connected to an output node connected to the light-emission line and a low voltage line;

a first separation transistor including a gate electrode connected to the forward clock signal line, wherein the first separation transistor is disposed between and connected to the forward start signal line and a gate electrode of the input transistor; and a second separation transistor including a gate electrode connected to the reverse clock signal line, wherein the second separation transistor is disposed between and connected to the reverse start signal line and the gate electrode of the input transistor.

7. The display device of claim 5, wherein the light-emission driving circuit includes:

a holding transistor disposed between and connected to an output node connected to the light-emission line and a high voltage line;

a first QB node holding transistor disposed between and connected to the high voltage line and a QH node, wherein the first QB node holding transistor is connected to a gate electrode of the holding transistor;

a second QB node holding transistor disposed between and connected to the high voltage line and the gate electrode of the holding transistor, wherein the second QB node holding transistor is connected to the QH node;

a third QB node holding transistor including a gate electrode connected to the forward clock signal line, wherein the third QB node holding transistor is disposed between and connected to the forward start signal line and the QH node; and a fourth QB node holding transistor including a gate electrode connected to the reverse clock signal line, wherein the fourth QB node holding transistor is disposed between and connected to the reverse start signal line and the QH node.

8. The display device of claim 5, wherein the light-emission driving circuit includes:

an input transistor disposed between and connected to an output node connected to the light-emission line and a low voltage line;

a first charging transistor including a first source/drain electrode connected to a gate electrode of the input transistor, a gate electrode, and a second source/drain electrode connected to the gate electrode thereof;

a second charging transistor disposed between and connected to the gate electrode of the first charging transistor and the low voltage line, wherein the second charging transistor includes a gate electrode connected to the output node; and a charging capacitor including a first electrode connected to the second source/drain electrode of the first charging transistor, and a second electrode connected to a QP node.

9. The display device of claim 8, wherein the plurality of light-emission driving lines further includes a forward low voltage line and a reverse low voltage line, wherein the light-emission driving circuit includes:

a third charging transistor disposed between and connected to the QP node and the forward clock signal line;

a fourth charging transistor disposed between and connected to the QP node and the reverse clock signal line;

a fifth charging transistor disposed between and connected to a gate electrode of the third charging transistor and the forward low voltage line, wherein the fifth charging transistor includes a gate electrode connected to the forward start signal line; and a sixth charging transistor disposed between and connected to a gate electrode of the fourth charging transistor and the reverse low voltage line, wherein the sixth charging transistor includes a gate electrode connected to the reverse start signal line.

10. A display device comprising:

a substrate including a pixel area including a plurality of sub-pixels and a non-pixel area surrounding the pixel area;

a plurality of pixel circuits disposed in the plurality of sub-pixels respectively;

a data pad and a gate pad disposed on one surface of the substrate and in the non-pixel area;

gate driving circuits disposed between two adjacent pixel areas in the non-pixel area and electrically connected to the gate pad and the plurality of pixel circuits;

a data line disposed on the substrate and in the pixel area and the non-pixel area and connected to the data pad and the plurality of pixel circuits;

a clock signal line electrically connected to the gate driving circuits arranged in a column direction and connected to the gate pad;

a gate line disposed on the substrate and extending in a row direction and the plurality of pixel circuits; and a plurality of light-emitting elements disposed on the substrate and connected to the plurality of pixel circuits, wherein the gate driving circuits arranged in the row direction are electrically connected to each other to provide a gate signal to the gate line, and wherein the clock signal line includes a forward clock signal line and a reverse clock signal line.

11. The display device of claim 10, wherein the display device further comprises:

a first power line disposed in the non-pixel area and between two adjacent pixel areas; and second power lines respectively disposed on both opposing sides of the gate driving circuit and disposed in the non-pixel area.

12. The display device of claim 11, wherein the display device further comprises:

a first power line pad disposed in the non-pixel area and connected to the first power line; and a second power line pad disposed in the non-pixel area and connected to a second power line, wherein the first power line pad, the gate pad, and the data pad are disposed on a first surface of the substrate, wherein the second power line pad is disposed on a second surface opposite to the first surface of the substrate.

13. The display device of claim 10, wherein the display device further comprises an alignment key disposed between the gate driving circuits adjacent to each other in the column direction and in the non-pixel area.

14. The display device of claim 10, wherein at least two light-emitting elements are disposed in the pixel area, wherein each of the at least two light-emitting elements comprises a micro light emitting diode (micro-LED).

15. The display device of claim 14, wherein the pixel area is a unit pixel area and includes four sub-pixels, wherein each of the four sub-pixels includes a pixel circuit including a driving transistor, wherein in the unit pixel area, two of a red light-emitting element, a green light-emitting element, and a blue light-emitting element electrically connected to the pixel circuits are disposed.

16. The display device of claim 10, wherein a gate driving circuit includes a light-emission driving circuit, wherein the light-emission driving circuit includes a light-emission signal holding circuit, a light-emission signal input circuit, a Q node reset circuit, a Q node charging circuit, an inverter circuit, a Q node holding circuit, and an input signal separation circuit.

17. The display device of claim 16, wherein the light-emission driving circuit further includes a QB node holding circuit.

18. The display device of claim 16, wherein each of the light-emission signal holding circuit and the light-emission signal input circuit outputs a light-emission signal and a carry signal, wherein each of the Q node charging circuit and the input signal separation circuit is connected to the forward clock signal line and the reverse clock signal line.

19. The display device of claim 1, wherein each gate driving circuit area is disposed between a pair of columns of pixel areas and includes a column of light-emission driving circuits.

20. The display device of claim 19, wherein a start signal is provided to a first end of the column of light-emission driving circuits that is propagated through a portion of the light-emission driving circuits toward a second end of the column of light-emission driving circuits.

21. The display device of claim 20, wherein a reverse start signal is provided to the second end of the column of light-emission driving circuit that is propagated through a portion of the light-emission driving circuits toward the first end.

* * * * *